(12) United States Patent
Kim et al.

(10) Patent No.: US 7,508,479 B2
(45) Date of Patent: Mar. 24, 2009

(54) LIQUID CRYSTAL DISPLAY

(75) Inventors: Hyung-Guel Kim, Yongin-si (KR); Dong-Ho Lee, Yongin-si (KR); Won-Seok Ma, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 222 days.

(21) Appl. No.: 10/199,831

(22) Filed: Jul. 19, 2002

(65) Prior Publication Data

US 2003/0090614 A1 May 15, 2003

(30) Foreign Application Priority Data

Nov. 15, 2001 (KR) ................ 2001-71153
Jan. 12, 2002 (KR) ................ 2002-1856

(51) Int. Cl.
*G02F 1/1345* (2006.01)

(52) U.S. Cl. .................................... 349/149

(58) Field of Classification Search ........ 349/42, 349/43, 149, 152, 151; 257/59, 72, 208; 345/84–92, 98, 100
See application file for complete search history.

(56) References Cited

U.S. PATENT DOCUMENTS

| | | | | |
|---|---|---|---|---|
| 4,373,784 A | * | 2/1983 | Nonomura et al. | 349/145 |
| 4,890,101 A | * | 12/1989 | Carlson | 345/55 |
| 5,041,822 A | * | 8/1991 | Hayashi | 345/87 |
| 5,453,858 A | | 9/1995 | Yamazaki | 359/59 |
| 5,479,283 A | * | 12/1995 | Kaneko et al. | 349/138 |
| 5,510,807 A | | 4/1996 | Lee et al. | 345/103 |
| 5,734,451 A | * | 3/1998 | Yanagawa et al. | 349/43 |
| 5,774,099 A | * | 6/1998 | Iwasaki et al. | 345/87 |
| 5,963,289 A | | 10/1999 | Stefanov et al. | |
| 6,198,133 B1 | | 3/2001 | Yamazaki et al. | 257/347 |
| 6,249,326 B1 | * | 6/2001 | Hebiguchi | 349/42 |
| 6,262,702 B1 | * | 7/2001 | Murade | 345/87 |

(Continued)

FOREIGN PATENT DOCUMENTS

CN  1154487 C  7/1997

(Continued)

OTHER PUBLICATIONS

PCT Notification of Transmittal of the International Search Report of the Declaration; International application No. PCT/KR02/01524; International filing date of: Aug. 9, 2002; Mailing date of : Nov. 4, 2003.

(Continued)

*Primary Examiner*—Kumiko C Koyama
(74) *Attorney, Agent, or Firm*—Cantor Colburn LLP

(57) ABSTRACT

An LCD capable of being reduced by a whole size and a defective proportion thereof being minimized. An LCD panel of the LCD includes a gate driving circuit that drives gate lines formed extended along a row direction and a line block selecting circuit that drives data lines extended along a column direction. On the LCD panel, an integrated driving chip having a controller, a memory, a level shifter, a source driver, a common voltage generator and a DC/DC converter is mounted. The integrated driving chip not only drives the gate driving circuit and line block selecting circuit, but also controls the operation of the LCD panel to display an image. Thus configured, a defective proportion of the LCD is decreased, with the whole size thereof being reduced.

62 Claims, 25 Drawing Sheets

U.S. PATENT DOCUMENTS

| | | | |
|---|---|---|---|
| 6,278,509 B1 * | 8/2001 | Ohga et al. | 349/150 |
| 6,323,930 B1 * | 11/2001 | Higuchi et al. | 349/152 |
| 6,388,652 B1 * | 5/2002 | Yamazaki et al. | 345/98 |
| 6,483,493 B2 * | 11/2002 | Murade | 345/87 |
| 6,507,384 B1 * | 1/2003 | Endo et al. | 349/149 |
| 6,535,264 B1 * | 3/2003 | Imabayashi et al. | 349/155 |
| 6,580,486 B1 * | 6/2003 | Sekine | 349/139 |
| 6,628,356 B2 * | 9/2003 | Shimada et al. | 349/106 |
| 6,791,129 B2 * | 9/2004 | Inukai | 257/208 |
| 6,847,344 B2 * | 1/2005 | Ha | 345/95 |

FOREIGN PATENT DOCUMENTS

| | | |
|---|---|---|
| CN | 1154488 C | 7/1997 |
| CN | 1294730 C | 5/2001 |
| CN | 1322015 A | 11/2001 |
| EP | 1 039 331 A2 | 9/2000 |
| JP | 1993-341311 | 12/1993 |
| JP | 2001142074 A | 5/2001 |

OTHER PUBLICATIONS

First Office Action for Ref. No.: Chichuan No. 09220155410; Date of Receipt: Feb. 21, 2003.

Second Office Action for Application No. 91101466; Date of Receipt: Feb. 5, 2007.

* cited by examiner

LIQUID CRYSTAL DISPLAY

BACKGROUND OF THE INVENTION

1. Field of the Invention

The present invention relates generally to a liquid crystal display (LCD), and more particularly, to an LCD capable of being reduced by a whole size with a defective proportion thereof being minimized.

2. Description of the Related Art

Information processing devices presently in existence have been rapidly developed to have various architectures, various functions and faster information processing speeds. Information processed in these information processing devices has an electrical signal format. In order to visually confirm the information processed in the information processing device, a display device is typically provided as an interface.

Compared with the traditional cathode ray tube (CRT), liquid crystal displays (LCDs) have certain advantages such as lighter weight, small size, high resolution, and lower power consumption. In addition, LCDs are easily adapted to their intended environment, and are further able to display a full range of colors. Such advantages allow LCDs to replace the CRTs and to be spotlighted as a next generation display.

In general, LCDs employ two substrates that have, respectively, an electrode and a thin film transistor LCD (TFT-LCD) that switches power applied to the electrode. A TFT-LCD may include amorphous silicon TFT-LCD (a-Si TFT-LCD) or polycrystalline silicon TFT-LCD (poly-Si TFT-LCD). Poly-Si TFT-LCD has advantages of lower power consumption and lower price as compared to a-Si TFT-LCD. However, a drawback of the Poly-Si TFT-LCD is that it has a relatively complicated manufacturing process. Thus, poly-Si TFT-LCD is mainly used in small sized display devices such as mobile phones. On the other hand, amorphous-Si TFT-LCD is typically used in large screen-sized display devices such as notebook computers, LCD monitors, high definition (HD) television receivers, and the like.

FIG. 1 is a simplified schematic view showing a liquid crystal display panel of an a-Si TFT-LCD in accordance with the conventional art.

Referring to FIG. 1, a-Si TFT-LCD 50 includes an LCD panel 10 having pixel arrays, driving printed circuit boards 36 and 42 for providing driving signals to the LCD panel 10, and tape carrier packages (TCP) 32 and 38 that electrically connect the LCD panel 10 to the driving printed circuit boards 36 and 42.

The driving printed circuit boards 36 and 42 include a data printed circuit board 36 that drives a plurality of data lines formed in the LCD panel 10 and a gate printed circuit board 42 that drives a plurality of gate lines formed in the LCD panel 10. The data printed circuit board 36 is connected to terminals of the plurality of data lines through the data side TCP 32, and the gate printed circuit board 42 is connected to terminals of the plurality of gate lines through the gate side TCP 38.

The a-Si TFT-LCD has a data driving chip 34 formed on the data side TCP 32 in accordance with a COF (Chip-On-Film) technique, and a gate driving chip 40 also formed on the gate side TCP 38 by COF.

Recently, there have been many endeavors to decrease the number of assembly process steps by simultaneously forming the data driving circuit and the gate driving circuit, along with the pixel array on a glass substrate in both a-Si TFT-LCDs and poly-Si TFT-LCDs.

FIG. 2 is a simplified schematic view showing an a-Si TFT-LCD panel having data and gate driving chips are disposed thereon, in accordance with the conventional art.

Referring to FIG. 2, a-Si TFT-LCD 90 includes a glass substrate 60 having a display region 60a, in which the pixel array is formed, and a peripheral region 60b adjacent to the display region 60a. On the peripheral region 60b, a plurality of data driving chips 61 and a plurality of gate driving chips 62 are formed thereon. Each of the output terminals of the plurality of data driving chips 61 is connected to a corresponding data line of a plurality of data lines, and each of output terminals of the plurality of gate driving chips 62 is connected to corresponding gate line of a plurality of gate lines. Output terminals of the data and gate driving chips 61 and 62 are connected to an integrated printed circuit board (not shown) through a flexible printed circuit board 70.

The flexible printed circuit board 70 includes a control driving chip 71 and a common voltage generator 72. The control driving chip 71 provides a timing signal and an image data signal to the data driving chips 61 and gate driving chips 62, respectively. The common voltage generator 72 generates a common voltage.

The structure in which the data and gate driving chip 61 and 62 are formed on the glass substrate 60 decreases the cost of the LCD and also minimizes power consumption due to the integration of the driving circuits. However, when a plurality of driving chips is formed on a glass substrate as shown in FIG. 2, there are several problems that arise. First, when a plurality of driving chips is formed on a glass substrate, the defect proportion increases in proportion to the number of the chips formed on the substrate. As a result, the yield of the LCD decreases because the LCD module is not able to be used, even if a single chip among the plurality of driving chips is defective. Further, when the defect proportion increases, the process time of the LCD becomes longer, and the productivity thereof becomes lower.

Second, from the standpoint of instrumental structure, the resulting size of the LCD increases by mounting a plurality of chips on the glass substrate. This is because the number of patterns to be formed on the glass substrate increases as the total number of the chips increases, and thus the size of the LCD panel has to be increased in order to obtain space for forming the patterns. As a result, the desired high resolution may not be achieved in an LCD having a restricted size requirement.

Third, since the plurality of chips is formed in one side portion adjacent to the LCD panel, the structure of the LCD panel becomes lopsided, and the whole size of the LCD becomes larger.

Fourth, from the standpoint of image displaying characteristics through the LCD panel, a uniformity of image cannot be maintained due to contact resistance between the plurality of chips and the glass substrate.

BRIEF SUMMARY OF THE INVENTION

An embodiment of the invention provides a liquid crystal display capable of decreasing a process time required to form the liquid crystal display and reducing a whole size thereof.

Another embodiment of the invention provides a liquid crystal display having an integrated driving chip, in which channel terminals are compatible with data lines.

A further embodiment of the invention provides a liquid crystal display capable of being applied to a display apparatus having a high vertical resolution.

Still another embodiment of the invention provides a liquid crystal display capable of increasing an effective display area thereof.

There is provided a liquid crystal display apparatus comprising a first substrate having a display region and a peripheral region adjacent to the display region, a second substrate facing the first substrate, and a liquid crystal interposed between the first and second substrates.

The first substrate includes a plurality of switching devices, a plurality of pixel electrodes, a plurality of gate lines, a plurality of data lines, a gate driving circuit, and an integrated driving chip. The plurality of switching devices is formed in the display region in a matrix. The plurality of pixel electrodes is formed in the display region in the matrix, and each of the plurality of pixel electrodes are connected to a first current electrode of each switching device of the plurality of switching devices. The plurality of gate lines is arranged in a row, and each of the plurality of gate lines is commonly connected to control electrodes of switching devices arranged in the row among the plurality of switching devices. The plurality of data lines is arranged in a column, and each of the plurality of data lines is commonly connected to second current electrodes of switching devices arranged in the column among the plurality of switching devices. The gate driving circuit is formed in a first region of the peripheral region to which first ends of the plurality of gate lines are extended, and sequentially scans the plurality of gate lines. The integrated driving chip is formed in a second region of the peripheral region to which first ends of the plurality of data lines are extended, for providing a driving control signal to the gate driving circuit in response to an external image data and a external control signal, and provides an analog signal to the plurality of data lines, respectively.

In another embodiment, there is provided a liquid crystal display apparatus comprising a first substrate having a display region and a peripheral region adjacent to the display region, a second substrate facing with the first substrate, and a liquid crystal interposed between the first and second substrates.

The first substrate includes a plurality of switching devices, a plurality of pixel electrodes, a plurality of gate lines, a plurality of data lines, a gate driving circuit, a line block selecting circuit, and an integrated driving chip. The plurality of switching devices is formed in the display region in a matrix. The plurality of pixel electrodes is formed in the display region in the matrix, and each of the plurality of pixel electrodes is connected to a first current electrode of each switching device of the plurality of switching devices. The plurality of gate lines is arranged in a row, and each of the plurality of gate lines is commonly connected to control electrodes of switching devices arranged in the row among the plurality of switching devices. The plurality of data lines is arranged in a column, and each of the plurality of data lines is commonly connected to second current electrodes of switching devices arranged in the column among the plurality of switching devices. The gate driving circuit is formed in a first region of the peripheral region to which first ends of the plurality of gate lines are extended, and sequentially scans the plurality of gate lines. The line block selecting circuit is formed in a second region of the peripheral region to which first ends of the plurality of data lines are extended, receives analog driving signals of block-units, selects one of line blocks of the plurality of data lines, and switches the analog driving signals of a block-unit to data lines of the selected line block. The integrated driving chip is formed in the second region, provides driving control signals to the gate driving circuit in response to an external image data and external control signals, and provides line block selecting signals and the analog signals of a block-unit to the line block selecting circuit.

The integrated driving chip comprises an interfacing part for interfacing the external image data and the external control signals, a memory for storing the external image data, a source driver for outputting the analog driving signals of block-units in response to image data of block-unit read out from the memory block by block, a level shifter for shifting a level of the driving control signals and the line block selecting signals, and a controller for storing the external image data into the memory in response to the external control signals inputted from the interfacing part, generating the driving control signals and the line block selecting signal, providing the driving control signals and the line block selecting signal to the level shifter, reading out image data block by block from the memory, and providing the image data read out block by block to the source driver.

The integrated driving chip further comprises a common voltage generator for generating a common voltage, and providing the common voltage to common electrode lines formed on a liquid crystal panel, and a DC/DC converter for receiving a external voltage, pulling-up or pulling-down the external voltage, and providing the pulled-up or pulled-down external voltage to the controller, the level shifter, the source driver and the common voltage generator.

The control signals include a main clock signal, a horizontal synchronizing signal, a vertical synchronizing signal, a data enable signal and a mode selecting signal, and the controller generates the line block selecting signal in response to the mode selecting signal.

The first line block comprises odd number data lines when the block has the size corresponding to ½ of the horizontal resolution and a second line block comprises even number data lines.

The line block selecting circuit comprises a plurality of first selecting transistors and a plurality of second selecting transistors. Each of the first current electrodes of the of first selecting transistors is connected to a corresponding first output terminal of first output terminals outputting the analog driving signals of the integrated driving chip, each of the second current electrodes is connected to a corresponding odd number data line of the odd number data lines, and each of control electrodes is connected to a corresponding second output terminal of second output terminals outputting the first line block selecting signals. Each of the first current electrodes is connected to the corresponding first output terminal of the first output terminals, each of the second current electrodes is connected to a corresponding even number data line of the even number data lines, and each of the control electrodes is connected to a corresponding third output terminal of third output terminals outputting the second line block selecting signals.

The first line block comprises (3n−2) number of data lines, a second line block comprises (3n−1) number of data lines, and a third line block comprises (3n) number of data lines when the block has the size corresponding to ⅓ of the horizontal resolution, wherein n is a natural number.

The line block selecting circuit comprises a plurality of first selecting transistors, a plurality of second selecting transistors, and a plurality of third selecting transistors. Each of the first current electrodes of the of first selecting transistors is connected to a corresponding first output terminal of first output terminals outputting the analog driving signals of the integrated driving chip, each of the second current electrodes is connected to a corresponding (3n−2) number data line of the (3n−2) number data lines, and each of the control electrodes is connected to a corresponding second output terminal of second output terminals outputting the first line block selecting signals. Each of the first current electrodes is connected to the corresponding first output terminal of the first output terminals, each of the second current electrodes is connected to a corresponding (3n−1) number data line of the (3n−1) number data lines, and each of the control electrodes is connected to a corresponding third output terminal of third output terminals outputting the second line block selecting signals. Each of the first current electrodes is connected to the corresponding first output terminal of the first output terminals, each of the second current electrodes is connected to a corresponding (3n) number data line of the (3n) number data lines, and each of the control electrodes is connected to a corresponding fourth output terminal of fourth output terminals outputting the third line block selecting signals.

In another embodiment, there is provided a liquid crystal display apparatus comprising a first substrate having a display region and a peripheral region adjacent to the display region, a second substrate facing the first substrate, and a liquid crystal interposed between the first and second substrates.

The first substrate includes a plurality of switching devices, a plurality of pixel electrodes, a plurality of gate lines, a plurality of data lines, a first gate driving circuit, a second gate driving circuit, a line block selecting circuit, and an integrated driving chip. The plurality of switching devices is formed in the display region in a matrix. The plurality of pixel electrodes is formed in the display region in the matrix, and each of the plurality of pixel electrodes is connected to a first current electrode of each switching device of the plurality of switching devices. The plurality of gate lines is arranged in a row, and each of the plurality of gate lines is commonly connected to control electrodes of switching devices arranged in the row among the plurality of switching devices. The plurality of data lines is arranged in a column, each of the plurality of data lines is commonly connected to second current electrodes of switching devices arranged in the column among the plurality of switching devices. The first gate driving circuit is formed in a first region of the peripheral region to which first ends of the plurality of gate lines are extended, and drives odd number gate lines of the plurality of gate lines. The second gate driving circuit is formed in a second region of the peripheral region to which second ends of the plurality of gate lines are extended, drives even number gate lines of the plurality of gate lines, and is connected to the first gate driving circuit through the plurality of gate lines in order to sequentially scan the plurality of gate lines. The line block selecting circuit is formed in a third region of the peripheral region to which first ends of the plurality of data lines are extended, receives analog driving signals of block-units, selects one of line blocks of the plurality of data lines, and switches the analog driving signals of a block-unit to data lines of the selected line block. The integrated driving chip is formed in the third region, provides driving control signals to the first and second gate driving circuits in response to an external image data and external control signals, and provides a line block selecting signals and the analog signals of a block-unit to the line block selecting circuit.

In a further embodiment, there is provided a liquid crystal display apparatus comprising a first substrate having a display region and a peripheral region adjacent to the display region, a second substrate facing with the first substrate, and a liquid crystal interposed between the first and second substrates.

The first substrate includes a plurality of switching devices, a plurality of pixel electrodes, a plurality of gate lines, a plurality of data lines, a line block selecting circuit, and an integrated driving chip. The plurality of switching devices is formed in the display region in a matrix. The plurality of pixel electrodes are formed in the display region in the matrix, and each of the plurality of pixel electrodes is connected to a first current electrode of each switching device of the plurality of switching devices. The plurality of gate lines is arranged in a row, and each of the plurality of gate lines is commonly connected to control electrodes of switching devices arranged in the row among the plurality of switching devices. The plurality of data lines is arranged in a column, each of the plurality of data lines is commonly connected to second current electrodes of switching devices arranged in the column among the plurality of switching devices. The line block selecting circuit is formed in a peripheral region to which first ends of the plurality of data lines are extended, receives analog driving signals of block-units, selects one of line blocks of the plurality of data lines, and switches the analog driving signals of a block-unit to the data lines of the selected line block. The integrated driving chip is formed in the peripheral region in which the line block selecting circuit is formed, receives external image data and external control signals, provides first gate driving signals to odd number gate lines of the plurality of gate lines, provides second gate driving signals to even number gate lines thereof, and provides line block selecting signals and the analog driving signals of a block-unit to the line block selecting circuit.

The integrated driving chip comprises an interfacing part, a memory for storing the external image data, a source driver, a level shifter, a first gate driver, a second gate driver, and a controller. The interfacing part interfaces the external image data and the external control signals. The source driver outputs the analog driving signals of block-units in response to image data of block-unit read out from the memory block by block. The level shifter shifts a level of a first driving control signal, a second driving control signal and the line block selecting signals. The first gate driver provides the first gate driving signal to the odd number gate lines of the plurality of gate lines in response to the first driving control signal. The second gate driver provides the second gate driving signal to the even number gate lines of the plurality of gate lines in response to the second driving control signal. The controller stores the external image data into the memory in response to the external control signals inputted from the interfacing part, generates the first and second driving control signals and the line block selecting signals, provides the first and second driving control signals and the line block selecting signals to the level shifter, reads out image data block by block from the memory, and provides the image data read out block by block to the source driver. According to the aforementioned LCD, only one integrated driving chip for driving the LCD panel is disposed in the peripheral region of the display region, thereby decreasing a process time, minimizing a defective proportion and reducing the whole size of the LCD panel.

In addition, the line block selecting circuit, which is formed in the peripheral region of the display region, and the TFT transistor, which is formed in the display region, are formed by means of only one process. The pixel data corresponding to one line is driven by means of the line block selecting circuit in a time-sharing method. Thereby, the channel terminals of the integrated driving chip are compatible with the data lines.

Further, the gate line driving circuit, which is formed in the left and right side of the peripheral regions of the display region, and the TFT transistor, which is formed in the display region, are formed by means of only one process. The gate line driving circuit is formed in a zigzag so that the gate line driving circuit is symmetrically formed in the left and right side of the peripheral regions. Also, the gate line driving circuit can be applied to a LCD having a high vertical resolution.

Moreover, the integrated driving chip, which has the gate driver for driving the plurality of gate lines and the source driver for driving the plurality of data lines, is disposed on the LCD panel, thereby increasing an effective display region of the LCD panel.

BRIEF DESCRIPTION OF THE DRAWINGS

The above objects and other advantages of the present invention will become more apparent by describing in detail the exemplary embodiments thereof with reference to the accompanying drawings, in which.

DETAILED DESCRIPTION OF THE PREFERRED EMBODIMENTS

Reference will now be made in detail to the exemplary embodiments of the present invention, examples of which are illustrated in the accompanying drawings. Hereinafter, exemplary embodiments are described with reference to the accompanying drawings.

Figure 1:
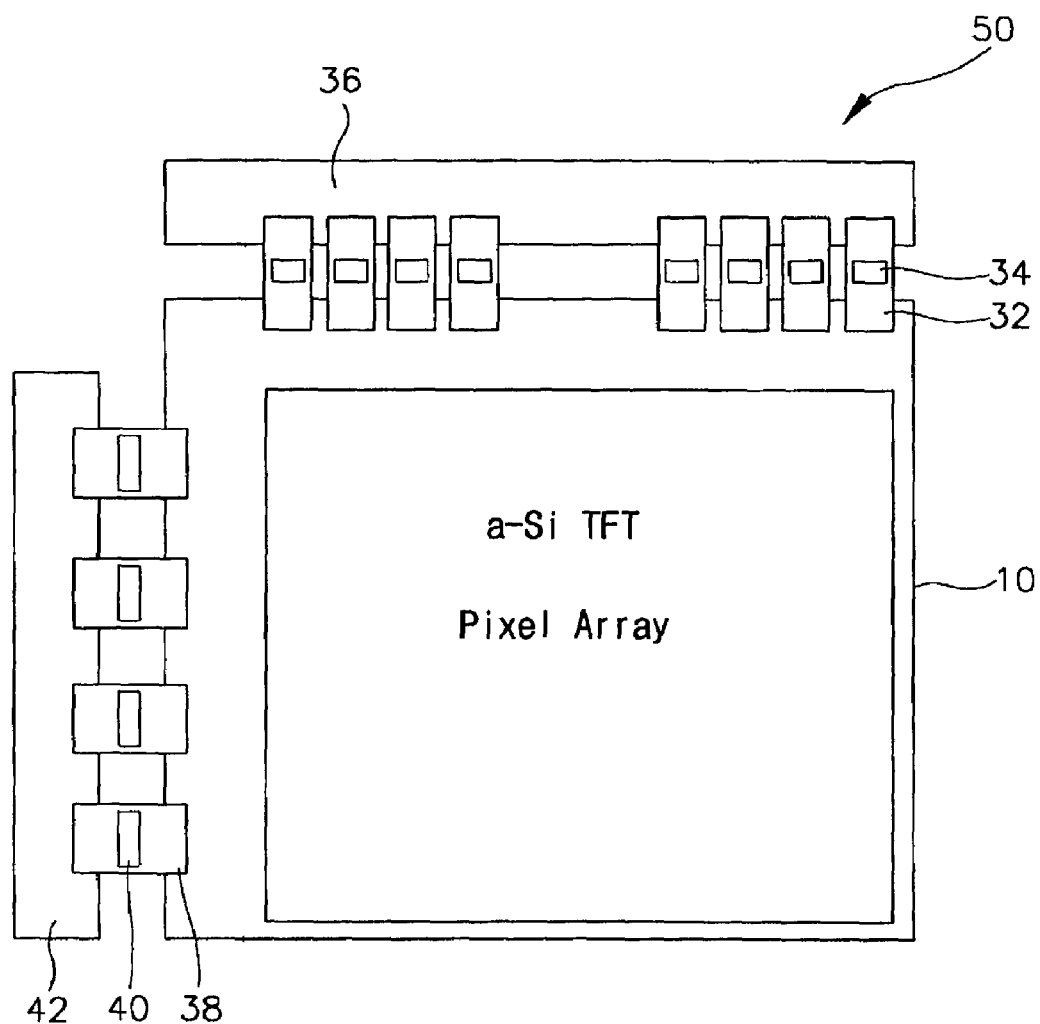
FIG. 1 is a simplified schematic view showing a liquid crystal display panel of an a-Si TFT-LCD in accordance with the conventional art.
Figure 2:
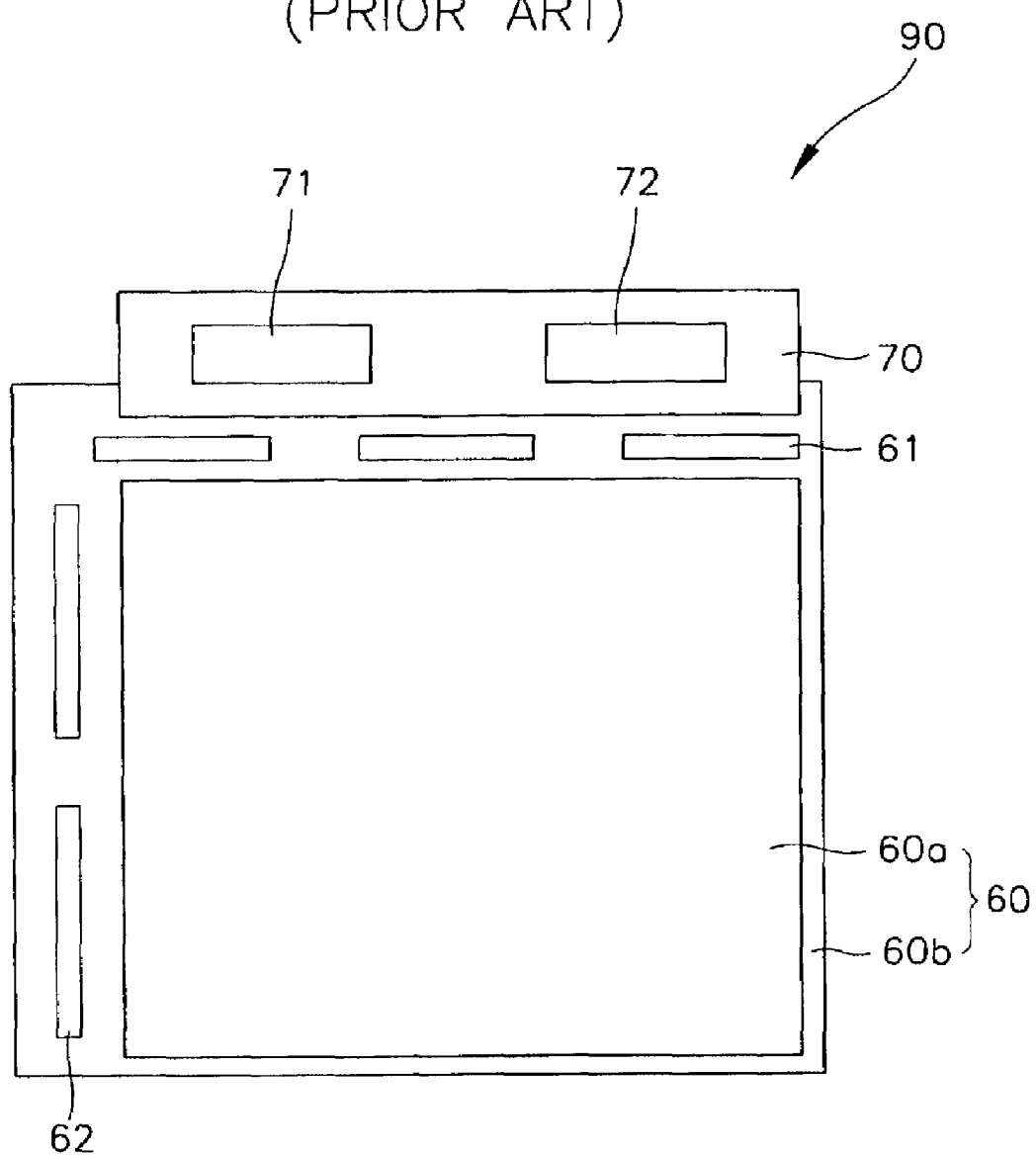
FIG. 2 is a simplified schematic view showing an a-Si TFT-LCD panel on which data and gate driving chips are disposed in accordance with the conventional art.
Figure 3:
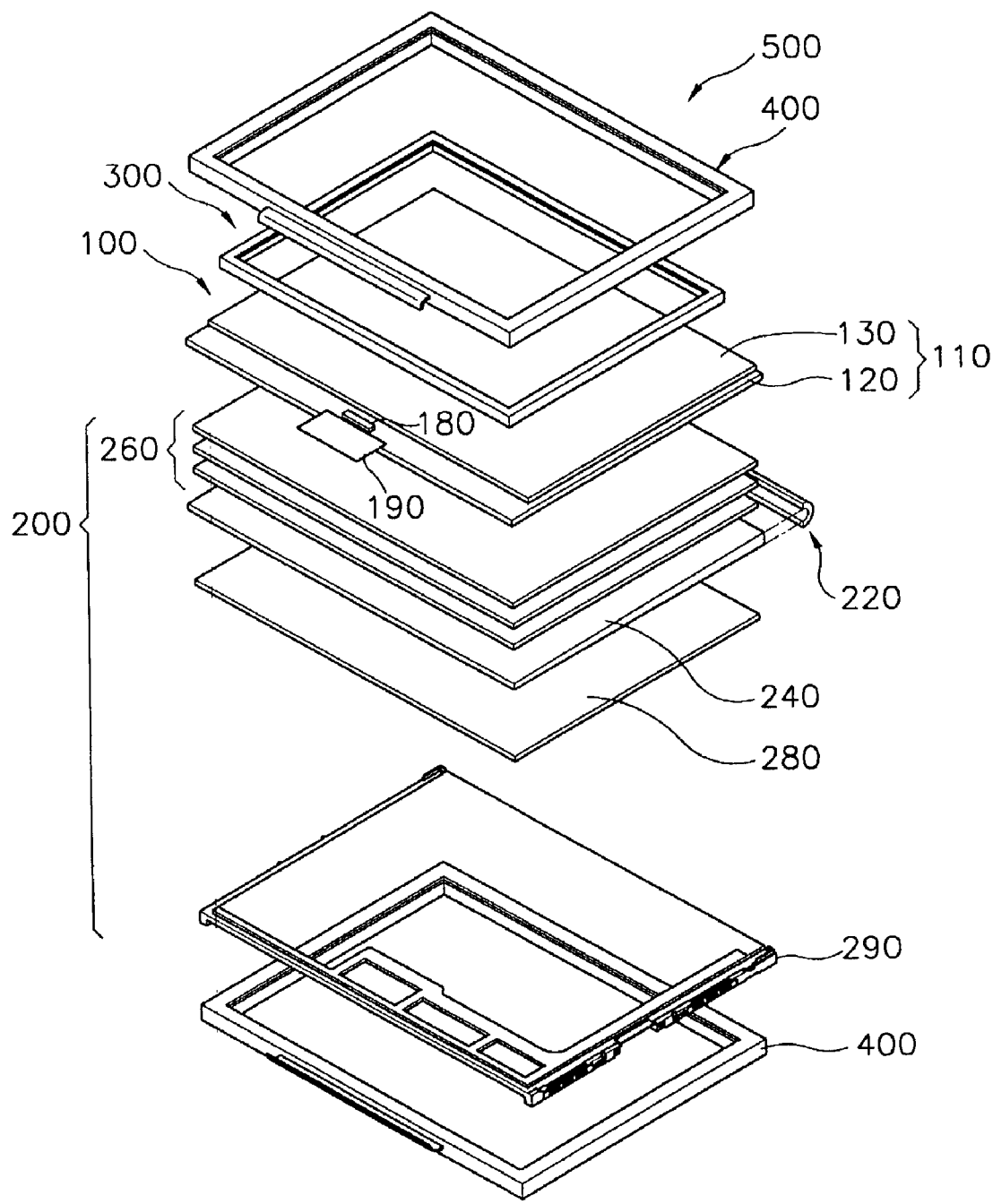
FIG. 3 is a disassembled perspective view of an LCD according to one embodiment of the present invention.

FIG. 3 is a disassembled perspective view of an LCD in accordance with the present invention.

Referring to FIG. 3, an LCD 500 includes an LCD panel assembly 100, a backlight assembly 200, a chassis 300 and a cover 400.

The LCD assembly 100 includes an LCD panel 110, a flexible printed circuit board (hereinafter referred to as an "FPC") 190, and an integral driving chip 180. The LCD panel 110 includes a TFT substrate 120 as a lower substrate, a color filter substrate 130 disposed on the TFT substrate 120, and a liquid crystal. The liquid crystal is injected between the TFT substrate 120 and the color filter substrate 130, and then an injection inlet of liquid crystal is sealed. On the TFT substrate 120, there are disposed a display cell array circuit, a gate driving circuit, and the integrated driving chip 180. The TFT substrate 120 faces the color filter substrate 130. The integrated driving chip 180 is electrically connected to an external circuit substrate (not shown) through the FPC 190.

RGB (red, green, blue) pixels and transparent common electrodes are formed on the color filter substrate 130.

The backlight assembly 200 includes a lamp assembly 220, a light guiding plate 240, a series of optical sheets 260, a reflector plate 280 and a mold frame 290.

Figure 4:
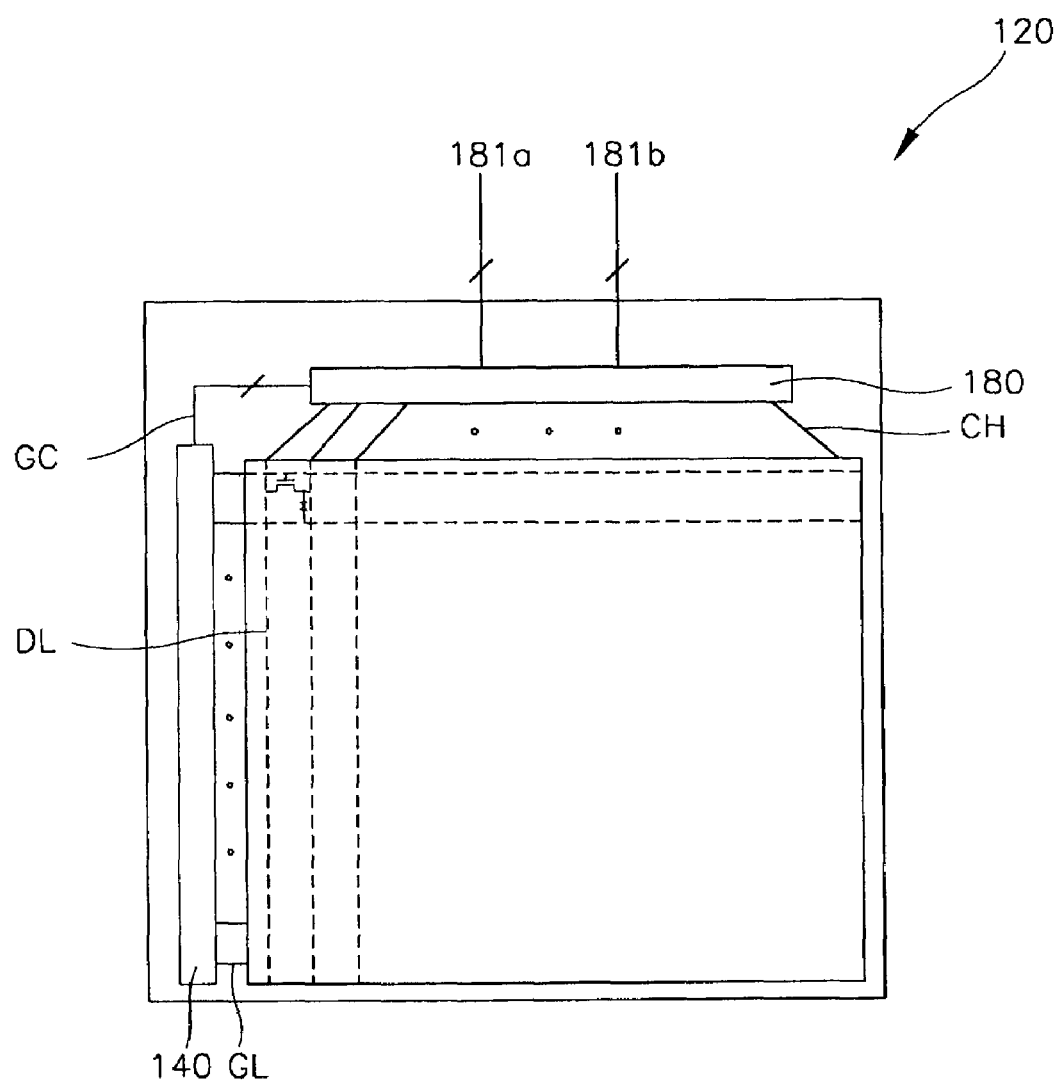
FIG. 4 is a schematic view showing a first embodiment of the TFT substrate shown in FIG. 3.

FIG. 4 is a schematic view showing a first embodiment of the TFT substrate shown in FIG. 3 in accordance with the present invention.

Referring to FIG. 4, the TFT substrate 120 is divided into a first region corresponding to the color filter substrate 130 and a second region not corresponding to the color filter substrate 130. The first region includes a display region and a peripheral region adjacent to the display region. On the display region, there are arranged a plurality of data lines DL extended along the row direction and a plurality of gate lines GL extended along the column direction. A gate driving circuit 140, which is connected to the plurality of gate lines GL, is integrated in the left side of the peripheral region.

In the second region of the TFT substrate 120, there is arranged the integrated driving chip 180 for controlling the operation of the LCD panel 110. The integrated driving chip 180 receives an external image data signal 181a and an external control signal 181b from the external circuit substrate separately disposed from the LCD panel 110. The integrated driving chip 180 provides a driving control signal GC to the gate driving circuit 140, and provides an analog driving signal (or, analog pixel data) to the plurality of data lines DL. First and second external connection terminals of the integrated driving chip 180 are connected to the FPC 190 that electrically connects the external circuit substrate and the integrated driving chip 180. The external image data signal 181a is inputted through the first external connection terminal, and the external control signal 181b is inputted through the second external connection terminal.

Among the plurality of output terminals of the integrated driving chip 180, each of the output terminals for outputting the driving control signal GC is connected to a corresponding one of the input terminals of the gate driving circuit 140. Each of the channel terminals CH is connected to corresponding one of the plurality of data lines DL. In addition, the terminals for outputting the driving control signal output GC further include a start signal output terminal, a first clock signal output terminal, a second clock signal output terminal, a first power voltage terminal and a second power voltage terminal.

Figure 5:
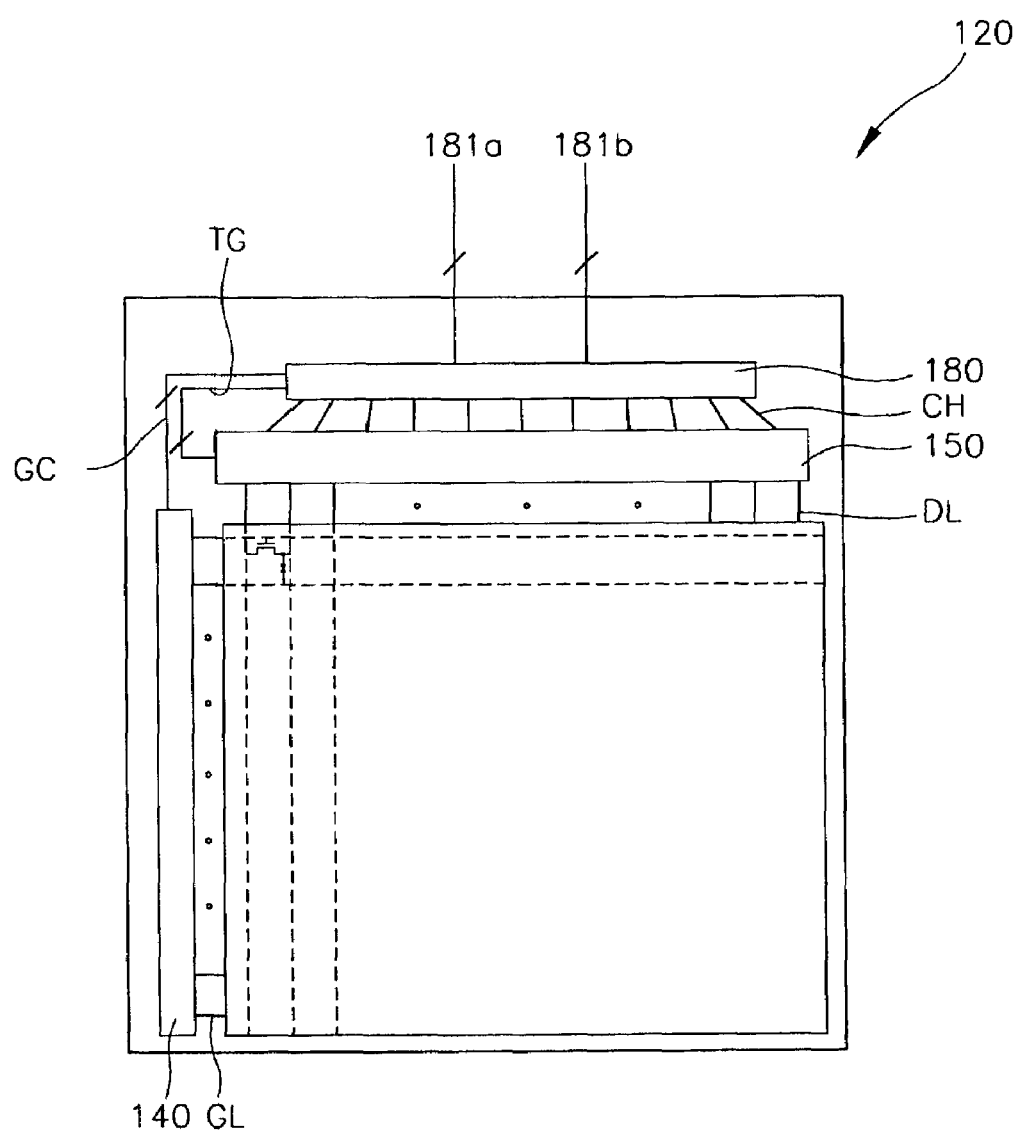
FIG. 5 is a schematic view showing a second embodiment of the TFT substrate shown in FIG. 3.

FIG. 5 is a schematic view showing a second embodiment of the TFT substrate shown in FIG. 3 in accordance with the present invention.

Referring to FIG. 5, the TFT substrate 120 is divided into the first region corresponding to the color filter substrate 130 and the second region not corresponding to the color filter substrate 130. The first region includes the display region and the peripheral region adjacent to the display region. On the display region, there are arranged the plurality of data lines DL extended along the row direction and the plurality of gate lines GL extended along the column direction. A gate driving circuit 140 is integrated in the left side of the peripheral region adjacent to the display region, and the gate driving circuit 140 is connected to the plurality of gate lines GL. A line block selecting circuit 150 is integrated in the upper side of the peripheral region, and is connected to the plurality of data lines DL.

In the second region of the TFT substrate 120, there is arranged the integrated driving chip 180 for controlling the operation of the LCD panel 110. The integrated driving chip 180 receives the external image data signal 181*a* and the external control signal 181*b* from the external circuit substrate separately disposed from the LCD panel 110. The integrated driving chip 180 provides the driving control signal GC and the analog driving signal to the gate driving circuit 140 and the plurality of data lines DL, respectively. First and second external connection terminals of the integrated driving chip 180 are connected to the FPC 190 that electrically connects the external circuit substrate and the integrated driving chip 180. The external image data signal 181*a* is inputted through the first external connection terminal, and the external control signal 181*b* is inputted through the second external connection terminal.

Among the plurality of output terminals of the integrated driving chip 180, each of the output terminals for outputting the driving control signal GC is connected to corresponding one of input terminals of the gate driving circuit 140. The output terminal of the line block selecting signal TG is connected to control terminals of the gate driving circuit 140. Each of the channel terminals CH is connected to corresponding one of the input terminals of the line block selecting circuit 150. Each of the output terminals of the line block selecting circuit 150 is connected to a corresponding one of the plurality of data lines DL. The number of the data lines DL is greater than the number of the channel terminals CH of the integrated driving chip 180 by N times, where N is an integer.

Figure 6:
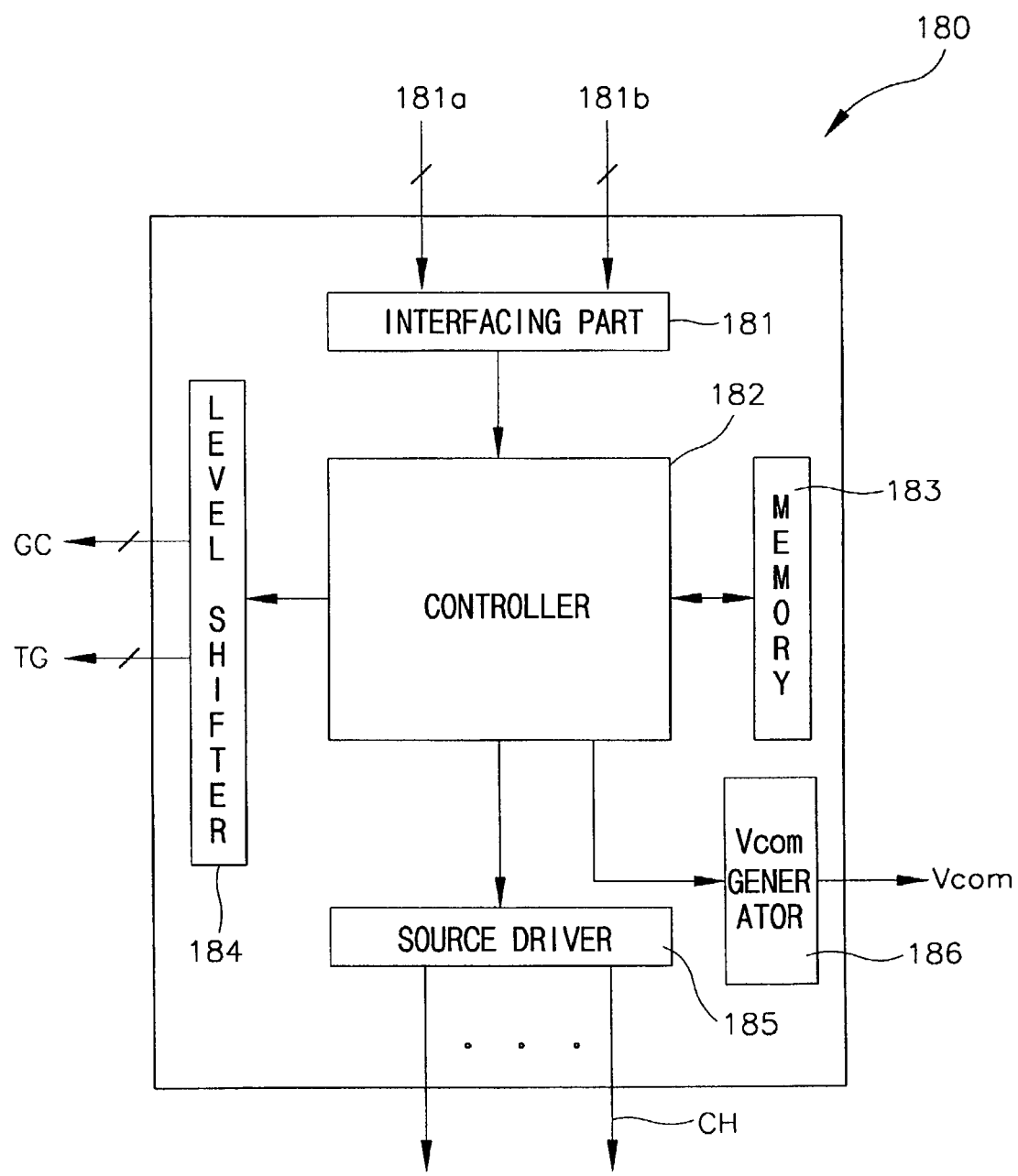
FIG. 6 is a block diagram showing a first embodiment of the integrated driving chip shown in FIG. 5.

FIG. 6 is a block diagram showing a first embodiment of the integrated driving chip shown in FIGS. 4 and 5.

Referring to FIG. 6, the integrated driving chip 180 includes an interfacing part 181, a memory 183, a source driver 185, a level shifter 184, a common voltage generator 186 and a controller 182.

The interfacing part 181 receives the external image data signal 181*a* and the external control signal 181*b*, and interfaces the controller 182 with external devices. The interfacing part 181 is compatible with a CPU interface, a video graphic board interface, and a media-Q interface.

The controller 182 receives the external image data signal 181*a* and external control signal 181*b* from the interfacing part 181, and stores the external image data signal 181*a* into the memory 183. The external control signal 181*b* includes horizontal and vertical synchronizing signals, a main clock signal, a data enable signal and a mode selecting signal. The controller 182 generates the line block selecting signal TG in response to the mode selecting signal.

In addition, the controller 182 provides the driving control signal GC and the line block selecting signal TG to the level shifter 184. The driving control signal includes a start signal ST, a first clock signal CK, a second clock signal CKB, a first power voltage VSS and a second power voltage VDD.

Further, the controller 182 provides digital image data to the source driver 185. That is, the controller 182 reads out block-by-block the external image data signal 181*a* stored into the memory, and provides the external image data signal to the source driver 185.

The memory 183 temporarily stores the external image data signal supplied from the controller 182. The memory 183 stores the external image data signal frame-by-frame or line-by-line. If a line memory is used as the memory 183 and the external image data signal is supplied from the controller 182 through 360 channels, the memory 183 has a storage capacity corresponding to two lines, that is 360×3×6×2=12,960 bits.

The source driver 185 receives the digital image data from the memory 183 block by block and outputs the analog driving signal block by block. Each of the channel terminals CH of the source driver 185 is connected to corresponding one of the plurality of data lines DL.

The level shifter 184 shifts a voltage level of the driving control signal GC and the line block selecting signal TG from the controller 182, and outputs the level-shifted driving control signal GC and the line block selecting signal TG. The level-shifted driving control signal GC includes a level-shifted start signal ST, a level-shifted first clock signal CK, a level-shifted second clock signal CKB, a level-shifted first power voltage VSS, and a level-shifted second power voltage VDD.

The common voltage generator 186 applies the common voltage Vcom to the common electrode line formed in parallel with the liquid crystal layer in order to maintain the voltage of the liquid crystal layer.

Figure 7:
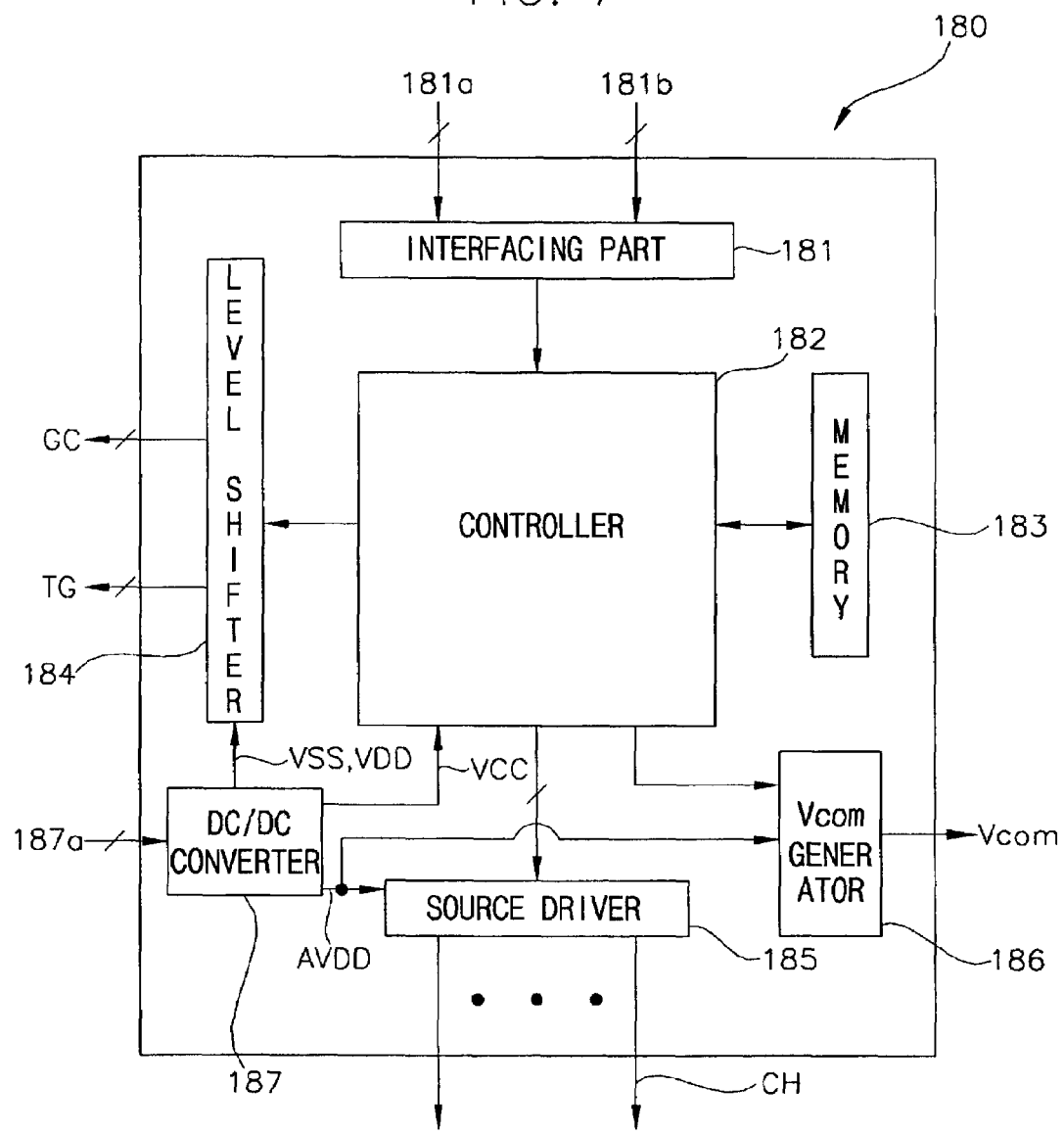
FIG. 7 is a block diagram showing a second embodiment of the integrated driving chip, according to another embodiment of the present invention.

FIG. 7 is a block diagram showing a second embodiment of the integrated driving chip shown in FIGS. 4 and 5.

Referring to FIG. 7, the integrated driving chip 180 includes the interfacing part 181, the memory 183, the source driver 185, the level shifter 184, the common voltage generator 186, a DC/DC converter 187, and the controller 182.

The DC/DC converter 187 receives a first DC power voltage 187*a* supplied from an external power source (not shown), and supplies second DC power voltages (AVDD, VSS, VDD, and VCC) to a corresponding circuit part of the integrated driving chip 180. In general, the DC/DC converter 187 receives the first DC power voltage 187*a* (being about 7 to 12 volts), and converts the first DC power voltage 187*a* to the second DC power voltages AVDD, VSS, VDD and VCC having (being about 5 volts).

The second DC power voltages AVDD, VSS, VDD and VCC, converted by means of the DC/DC converter 187, are supplied to the source driver 185, level shifter 184, common voltage generator 186 and controller 182, respectively. Particularly, the DC/DC converter 187 provides the analog driving power voltage AVDD to the source driver 185 and the common voltage generator 186, and also provides the image driving power voltage VSS and VDD to the level shifter 184. The digital driving power VCC is supplied to the controller 182.

Hereinafter, the line block selecting circuit 150 (connected between the channel terminals CH of the integrated driving chip 180 and the plurality of data lines DL for selectively applying the pixel data from the integrated driving chip 180 to the plurality of data lines DL) will be described with reference to the accompanying drawings.

Figure 8:
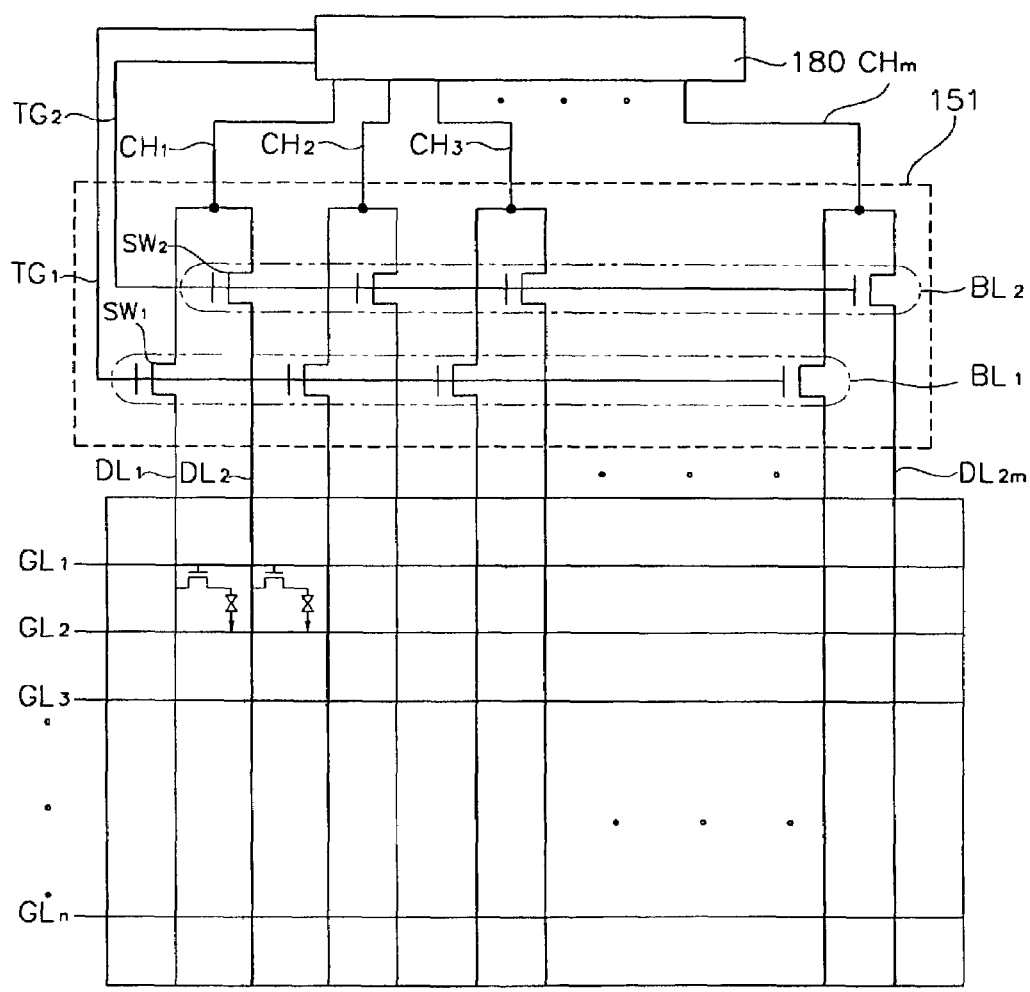
FIG. 8 is a circuit diagram showing a first line block selecting circuit that selectively drives the plurality of data lines divided into two blocks.
Figure 9:
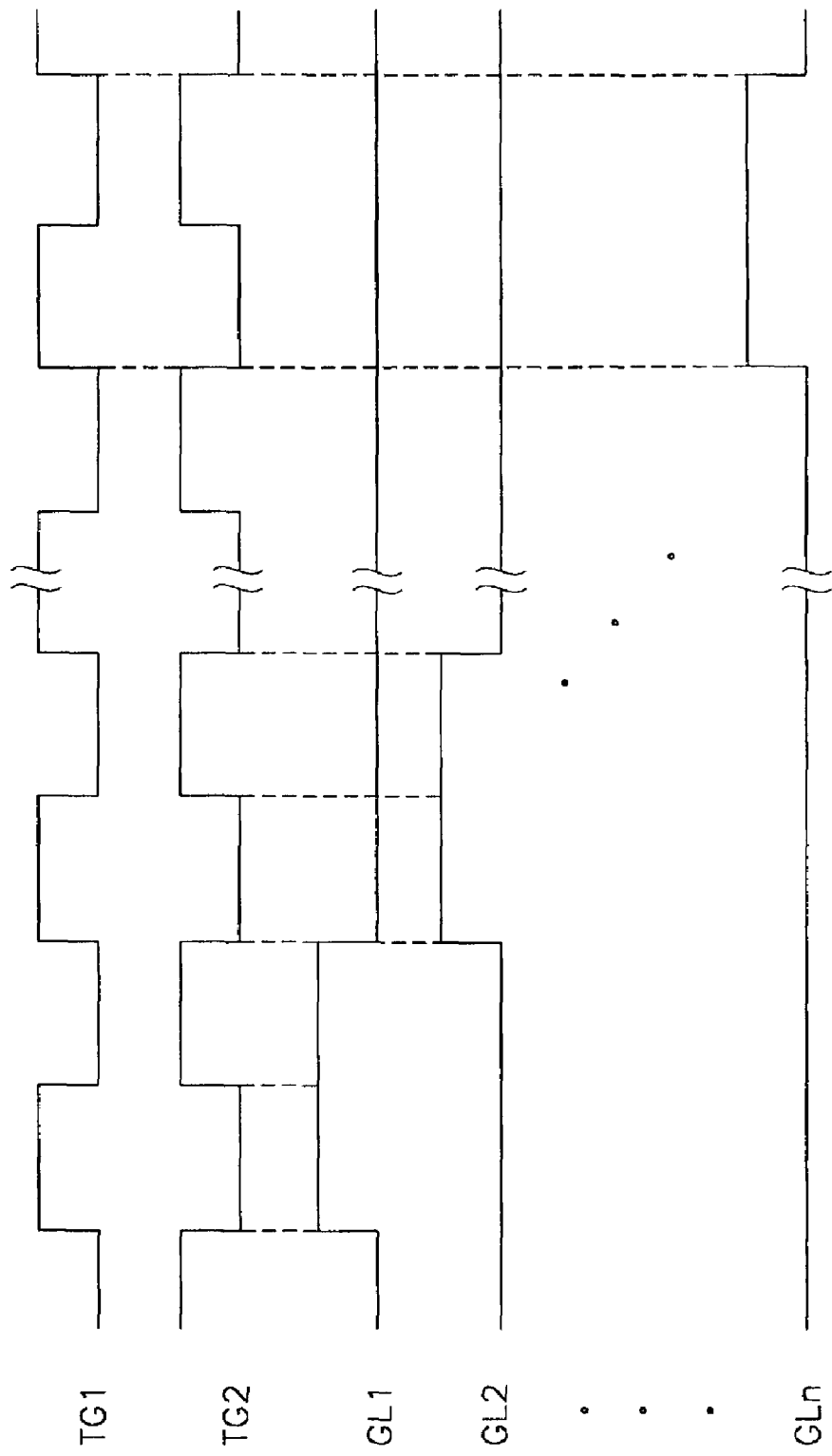
FIG. 9 is an output waveform of the first line block selecting circuit shown in FIG. 8.

FIG. 8 is a circuit diagram showing the first line block selecting circuit that selectively drives the data lines that are divided into two blocks, while FIG. 9 is a simulated waveform of the first line block selecting circuit.

Referring to FIG. 8, the first line block selecting circuit 151 is formed in the upper side of the peripheral region adjacent to the TFT substrate 120, and periodically applies the analog driving signal provided by the integrated driving chip 180 to the plurality of data lines—(designated DL1 through DL2$m$) block by block.

In particular, the first line block selecting circuit 151 has 2$m$ data lines and is divided into first and second blocks BL1 and BL2, each respectively having $m$ data lines. The first block BL1 includes $m$ odd numbered data lines from DL1 to DL2$m$−1, and the second block BL2 includes $m$ even numbered data lines from DL2 to DL2$m$.

Each of the channel terminals CH1 through CH$m$ of the integrated driving chip 180 is commonly connected to a corresponding pair of data lines. For example, the first channel terminal CH1 of the integrated driving chip 180 is commonly connected to the first and second data lines DL1 and DL2.

The first block BL1 of the first line block selecting circuit 151, connected to the channel terminals CH1 through CH$m$ and the odd numbered data lines DL1 through DL2$m$−1, includes a first selecting transistor SW1 driven by means of the first line block selecting signal (TG1) from the integrated driving chip 180. Correspondingly, the second block BL2, connected to the channel terminals CH1 through CH$m$ and the even numbered data lines DL2 through DL2$m$, includes a second selecting transistor SW2 driven by means of the second line block selecting signal (TG2) from the integrated driving chip 180. Signals TG1 and TG2 are alternately at a logic high level. That is, when TG1 is at logic high, TG2 is at logic low, and vice versa.

When signal TG1 is at logic high, the first selecting transistor SW1 is driven thereby, and the analog driving signals from the channel terminals CH1 through CH$m$ are supplied to the odd numbered data lines DL1 through DL2$m$−1. Conversely, when signal TG2 is at logic high, the second selecting transistor SW2 is driven thereby, and the analog driving signal from the channel terminals CH1 through CH$m$ are supplied to the even numbered data lines DL2 through DL2$m$.

As shown in FIG. 9, when gate lines GL1 through GL$n$ are sequentially driven, signals TG1 and TG2 are alternately high during an active period of each of the plurality of gate lines GL1 through GL$n$. That is, signal TG1 is at the logic high level for the first half of the total active period of gate lines GL1 through GL$n$, and signal TG2 thereafter maintains the logic high level for the remaining half of the total period of gate lines GL1 through GL$n$. Thus, when signal TG1 is at logic high, the first selecting transistor SW1 is driven thereby and the analog driving signal is supplied to data line DL2$m$−1 of the first block BL1. Also, when signal TG2 is at logic high, the second selecting transistor SW2 is driven thereby, and the analog driving signal is applied to data line DL2$m$ of the second block BL2.

Further, when the signal TG1 is at logic high during the active period of the second gate line GL2, the first selecting transistor SW1 is driven, and the analog driving signal is supplied to data line DL2$m$−1 of the first block BL1. When signal TG2 is at logic high, the second selecting transistor SW2 is driven, and the analog driving signal is supplied to data line DL2$m$ of the second block BL2.

Figure 10:
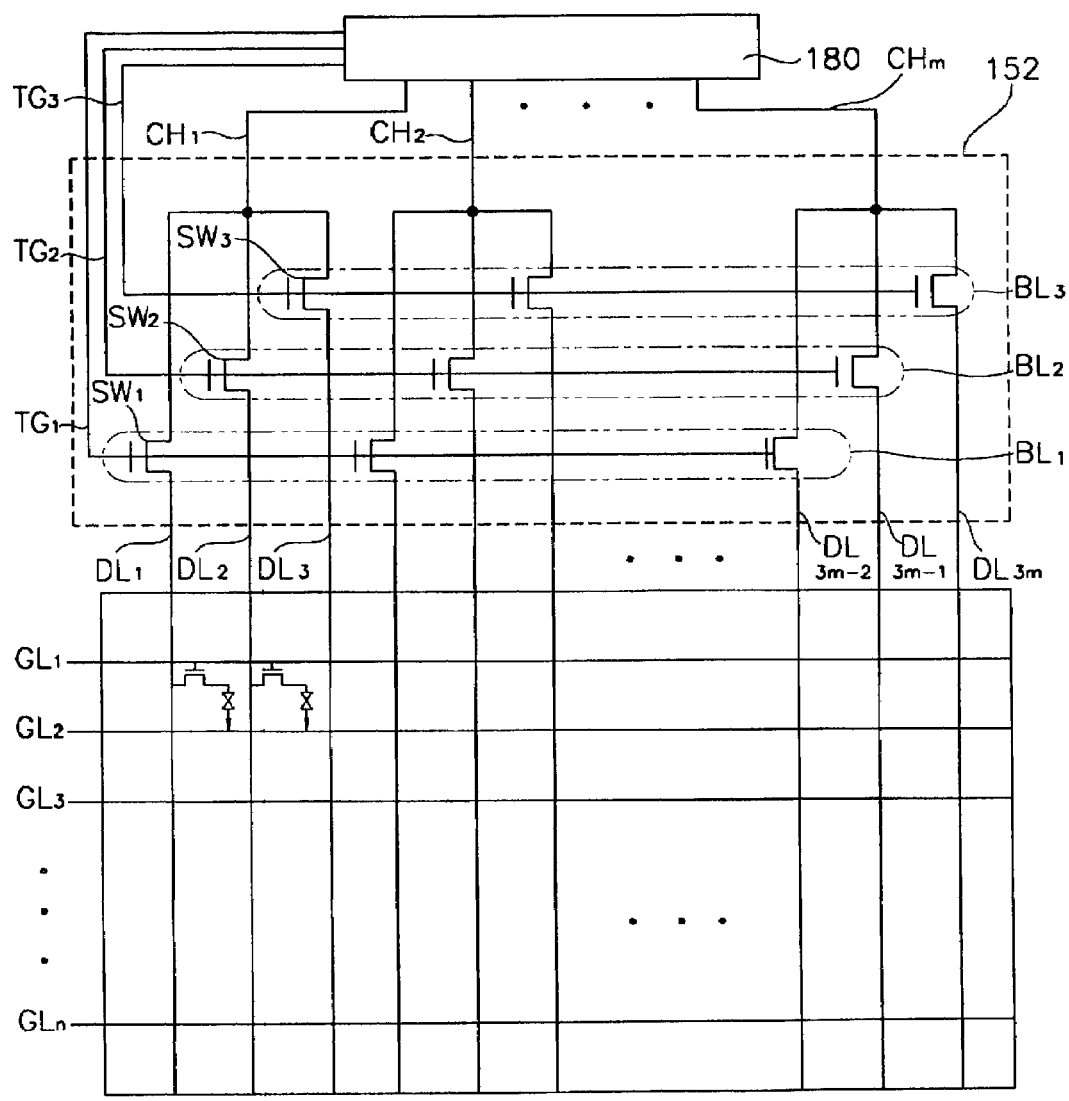
FIG. 10 is a circuit diagram showing the second line block selecting circuit that selectively drives the plurality of data lines divided into three blocks.
Figure 11:
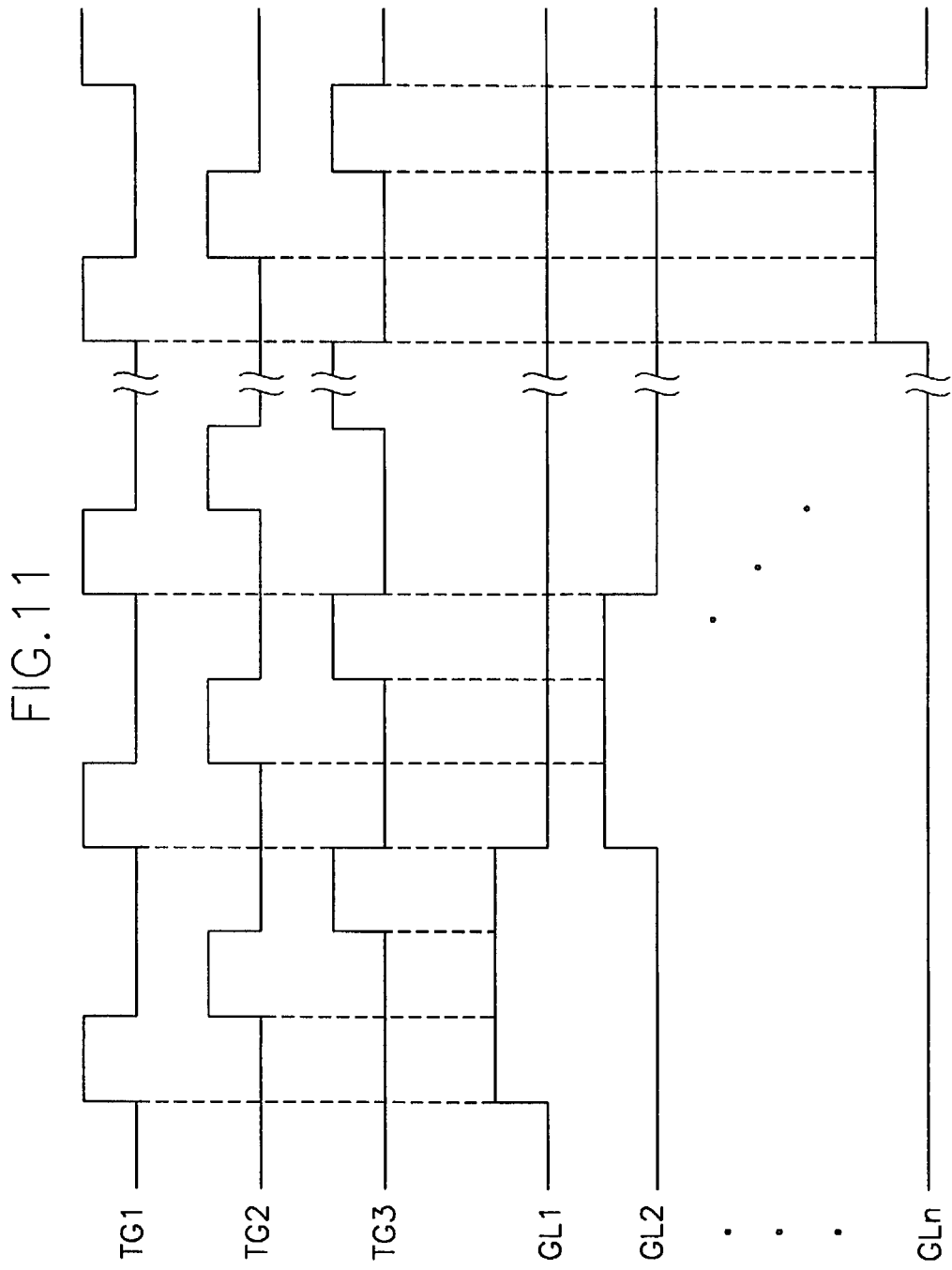
FIG. 11 is an output waveform of the second line block selecting circuit shown in FIG. 10.

FIG. 10 is a circuit diagram showing the second line block selecting circuit that selectively drives the data lines that are divided into three blocks in this embodiment, while FIG. 11 is a simulated waveform of the second line block selecting circuit shown in FIG. 10.

Referring to FIG. 10, the second line block selecting circuit 152 is formed in the upper side of the peripheral region adjacent to the TFT substrate 120, and periodically applies the analog driving signal from the integrated driving chip 180 to the plurality of data lines, designated DL1 through DL3$m$, block by block.

In particular, the second line block selecting circuit 152 (having 3$m$ data lines) is divided into first, second and third blocks BL1, BL2 and BL3, respectively, each having $m$ data lines associated therewith. The first block BL1 includes $m$ data lines up to data line DL3$m$−2, (i.e., DL1, DL4, DL7, etc.) The second block BL2 includes $m$ data lines up to data line DL3$m$−1, (i.e., DL2, DL5, DL8, etc.) The third block BL3 includes $m$ data lines up to data line DL3$m$, (i.e., DL3, DL6, DL9, etc.) Each of the channel terminals CH1 through CH$m$ of the integrated driving chip 180 is commonly connected to a corresponding group of three data lines. That is, the first channel terminal CH1 of the integrated driving chip 180 is commonly connected to the first, second and third data lines (DL1, DL2 and DL3.) The first block BL1 of the second line block selecting circuit 152 includes a first selecting transistor SW1, which is connected to channel terminals CH1 through CH$m$ and to every third data line from DL1 to DL3$m$−2, and is driven by means of the first line block selecting signal (TG1) from the integrated driving chip 180. Similarly, the second block BL2 includes a second selecting transistor SW2, which is connected to channel terminal CH1 through CH$m$ and to every third data line from DL2 to DL3$m$−1, and is driven by means of the second line block selecting signal (TG2) from the integrated driving chip 180. Further, the third block BL3 includes a third selecting transistor SW3, which is connected to channel terminal CH1 through CH$m$ and to every third data line from DL3 to DL3$m$, and is driven by means of the third line block selecting signal (TG3) from the integrated driving chip 180. As will be described, signals TG1, TG2 and TG3 are alternately driven to a high level.

When signal TG1 is at logic high, the first selecting transistor SW1 is driven thereby, and thus the analog driving signals from channel terminals CH1 through CH$m$ are supplied to DL1, DL4, DL7, . . . , DL3$m$. When signal TG2 is at logic high, the second selecting transistor SW2 is driven thereby, and thus the analog driving signal from the channel terminals CH1 through CH$m$ are supplied to DL2, DL5, DL8, . . . , DL3$m$−1. Finally, when signal TG3 is at logic high, the third selecting transistor SW3 is driven thereby, and thus the analog driving signal from channel terminals CH1 through CH$m$ are supplied to DL3, DL6, DL9, . . . , DL3$m$.

As shown in FIG. 11, when gate lines GL1 through GL$n$ are sequentially driven by the gate line driving circuit 140, signals TG1, TG2 and TG3 are sequentially at the logic high level during an active period of each of the gate lines of GL1 through GL$n$. That is, signals TG1, TG2 and TG3 are at the logic high level one-third of the active period of gate lines GL1 through GL$n$.

Accordingly, when signal TG1 is at logic high during the active period of the first gate line GL1, the first selecting transistor SW1 is driven, and the analog driving signal is supplied to data line DL3m–2 of the first block BL1. Also, when signal TG2 is at logic high, the second selecting transistor SW2 is driven, and the analog driving signal is applied to data line DL3m–1 of the second block BL2. In addition, when signal TG3 is at logic high, the third selecting transistor SW3 is driven, and the analog driving signal is applied to the data line DL3m of the third block BL3.

When signal TG1 is at logic high during the active period of the second gate line GL2, the first selecting transistor SW1 is driven, and the analog driving signal is supplied to data line DL3m–2 of the first block BL1. Also, when signal TG2 is at logic high, the second selecting transistor SW2 is driven, and the analog driving signal is applied to data line DL3m–1 of the second block BL2. When signal TG3 signal is at logic high, the third selecting transistor SW3 is driven, and the analog driving signal is applied to data line DL3m of the third block BL3.

Figure 12:
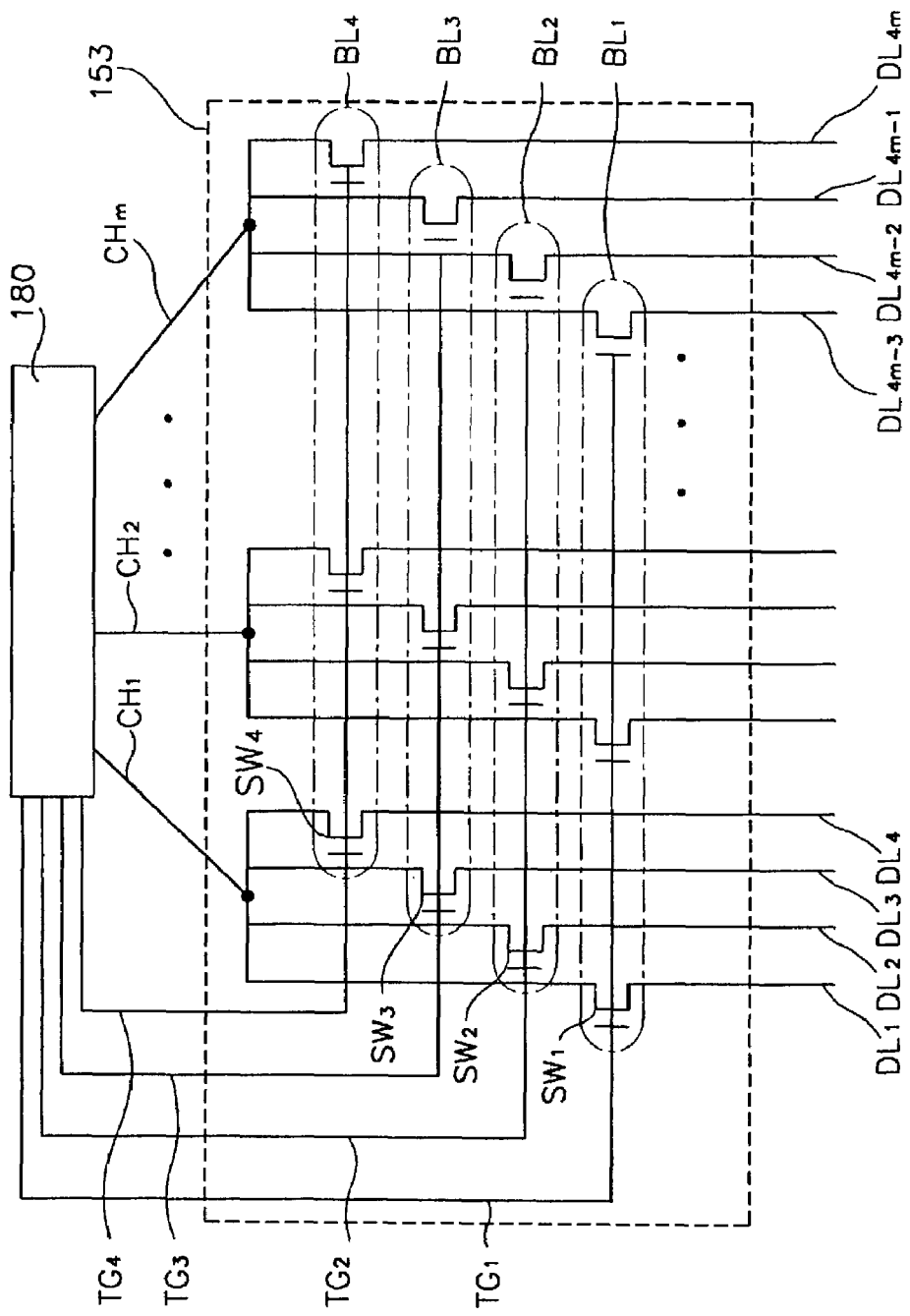
FIG. 12 is a circuit diagram showing the third line block selecting circuit that selectively drives the plurality of data lines divided into four blocks.
Figure 13:
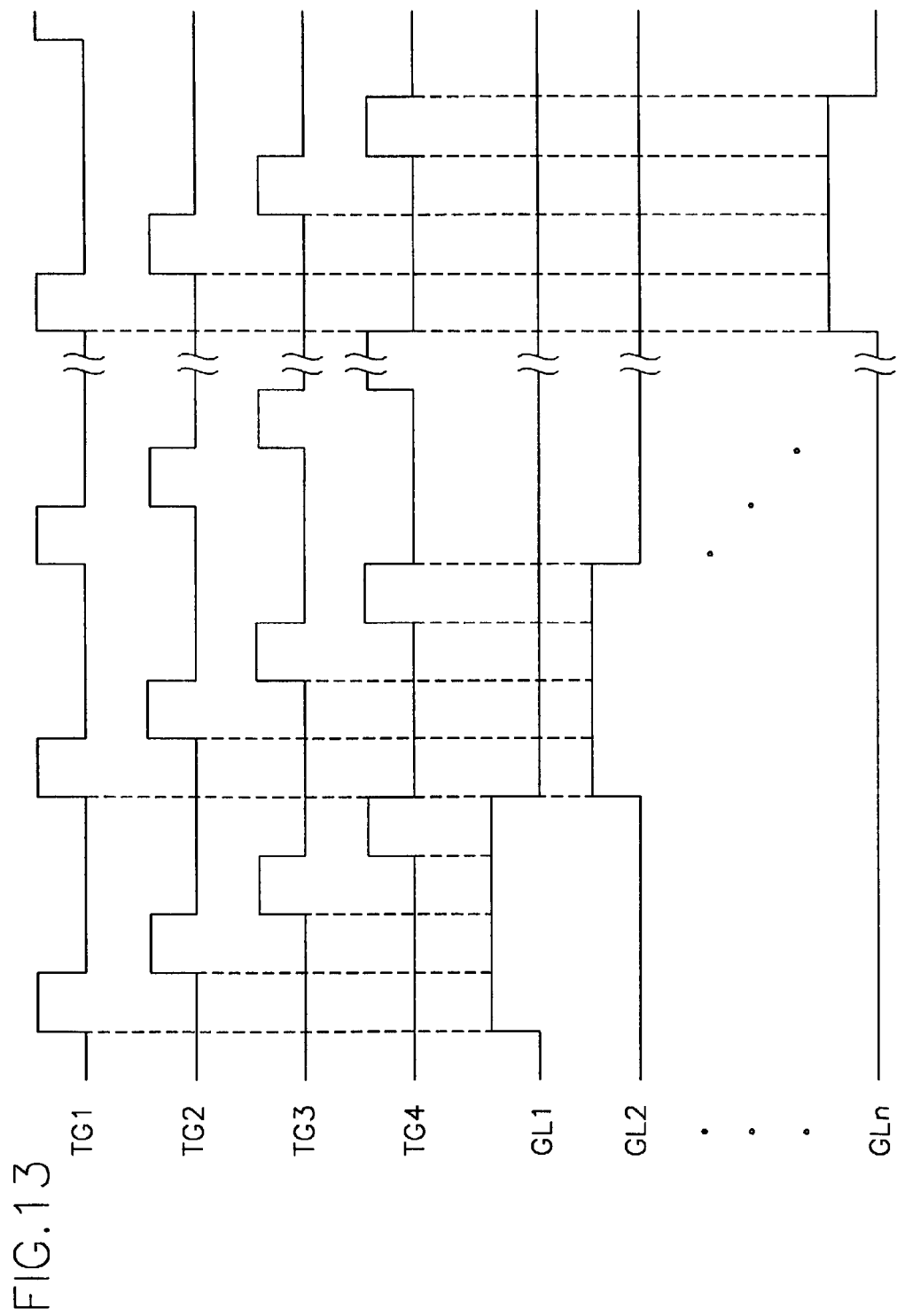
FIG. 13 is an output waveform of the third line block selecting circuit shown in FIG. 12.

FIG. 12 is a circuit diagram showing the third line block selecting circuit that selectively drives the plurality of data lines divided into four blocks, while FIG. 13 is a simulated waveform of the third line block selecting circuit shown in FIG. 12.

Referring to FIG. 12, the third line block selecting circuit 153 is formed in the upper side of the peripheral region adjacent to the TFT substrate 120, and periodically applies the analog driving signal from the integrated driving chip 180 to the plurality of data lines, designated DL1 through DL4m, block by block.

In particular, the third line block selecting circuit 153 (having 4m data lines) is divided into first, second, third and fourth blocks BL1, BL2, BL3 and BL4, respectively, each having m data lines associated therewith. The first block BL1 includes m data lines up to DL4m–3, (i.e., DL1, DL5, DL9, etc.) The second block BL2 includes m data lines up to DL4m–2, (i.e., DL2, DL6, DL10, etc.) The third block BL3 includes m data lines up to DL4m–1, (i.e., DL3, DL7, DL11, etc.) The fourth block BL4 includes m data lines up to DL4m, (i.e., DL4, DL8, DL12, etc.) Each of the channel terminals CH1 through CHm of the integrated driving chip 180 is commonly connected to a corresponding group of four data lines. That is, the first channel terminal CH1 of the integrated driving chip 180 is commonly connected to DL1, DL2, DL3 and DL4.

The first block BL1 of the third line block selecting circuit 153 includes a first selecting transistor SW1, which is connected to channel terminals CH1 through CHm and to every fourth data line from DL1 to DL4m–3, and is driven by means of the first line block selecting signal (TG1) from the integrated driving chip 180. Also, the second block BL2 includes a second selecting transistor SW2, which is connected to channel terminals CH1 through CHm and to every fourth data line from DL2 to DL4m–2, and is driven by means of the second line block selecting signal (TG2) from the integrated driving chip 180. The third block BL3 includes a third selecting transistor SW3, which is connected to the channel terminals CH1 through CHm and to every fourth data lines from DL3 to DL4m–1, and is driven by means of the third line block selecting signal (TG3) from the integrated driving chip 180. The fourth block BL4 includes a fourth selecting transistor SW4, which is connected to channel terminals CH1 through CHm and to every fourth data line from DL4 to DL4m, and is driven by means of the fourth line block selecting signal (TG4) from the integrated driving chip 180. As will be described, signals TG1, TG2, TG3 and TG4 are alternately driven to a logic high level.

When the signal TG1 is at logic high, the first selecting transistor SW1 is driven thereby, and the analog driving signals from channel terminals CH1 through CHm are supplied to DL1, DL5, DL9, . . . , DL4m–3. When signal TG2 signal at logic high, the second selecting transistor SW2 is driven thereby, and the analog driving signals from channel terminals CH1 through CHm are supplied to the DL2, DL6, DL10, . . . , DL4m–2. When signal TG3 is at logic high, the third selecting transistor SW3 is driven thereby, and the analog driving signal from channel terminals CH1 through CHm are supplied to DL3, DL7, DL11, . . . , DL4m–1. When signal TG4 is at logic high, the fourth selecting transistor SW4 is driven thereby, and the analog driving signal from channel terminals CH1 through CHm are supplied to DL4, DL8, DL12, . . . , DL4m.

As shown in FIG. 13, when gate lines GL1 through GLn are sequentially driven by the gate line driving circuit 140, each of the signals TG1, TG2, TG3 and TG4 has are sequentially at the logic high level during an active period of gate lines GL1 through GLn. That is, signals TG1, TG2, TG3 and TG4 are at the logic high level for one-fourth of the active period of gate lines of GL1 through GLn.

Accordingly, when signal TG1 is at logic high during the active period of the first gate line GL1, the first selecting transistor SW1 is driven, and the analog driving signal is supplied to data line DL4m–3 of the first block BL1. When signal TG2 I is at logic high, the second selecting transistor SW2 is driven, and the analog driving signal is supplied to data line DL4m–2 of the second block BL2. In addition, when signal TG3 is at logic high, the third selecting transistor SW3 is driven, and the analog driving signal is supplied to data line DL4m–1 of the third block BL3. When signal TG4 is at logic high, the fourth selecting transistor SW4 is driven, and the analog driving signal is supplied to data line DL4m of the fourth block BL4.

When signal TG1 is at logic high during the active period of the second gate line GL2, the first selecting transistor SW1 is driven, and the analog driving signal is supplied to data line DL4m–3 of the first block BL1. When signal TG2 is at logic high, the second selecting transistor SW2 is driven, and the analog driving signal is supplied to data line DL4m–2 of the second block BL2. In addition, when signal TG3 is at logic high, the third selecting transistor SW3 is driven, and the analog driving signal is supplied to data line DL4m–1 of the third block BL3. When signal TG4 is at logic high, the fourth selecting transistor SW4 is driven, and the analog driving signal is supplied to data line DL4m of the third block BL4.

As shown in FIGS. 8 to 13, although the number, m, of channel terminals (CH1 through CHm) of the integrated driving chip 180 is the same for each embodiment, is the chip is still able to supply the analog driving signal to the plurality of data lines by increasing the number (e.g., 2, 3, 4 or more) of the data lines commonly connected to the channel terminals CH1 through CHm. Thus, the resolution of the LCD 500 can be variously realized. The specific number of the data lines used is determined in accordance with a charging time of the analog driving signal. However, when a main clock signal is divided by 3, 4, 5 or more segments in order to increase the resolution of the LCD 500, the charging time decreases. Therefore, it is desirable that the resolution of the LCD 500 is increased, while considering the charging time of the analog driving signal.

Hereinafter, the gate driving circuit 140 formed in the left side of the peripheral region adjacent to the LCD panel will be described with reference to the accompanying drawings in detail.

Figure 14:
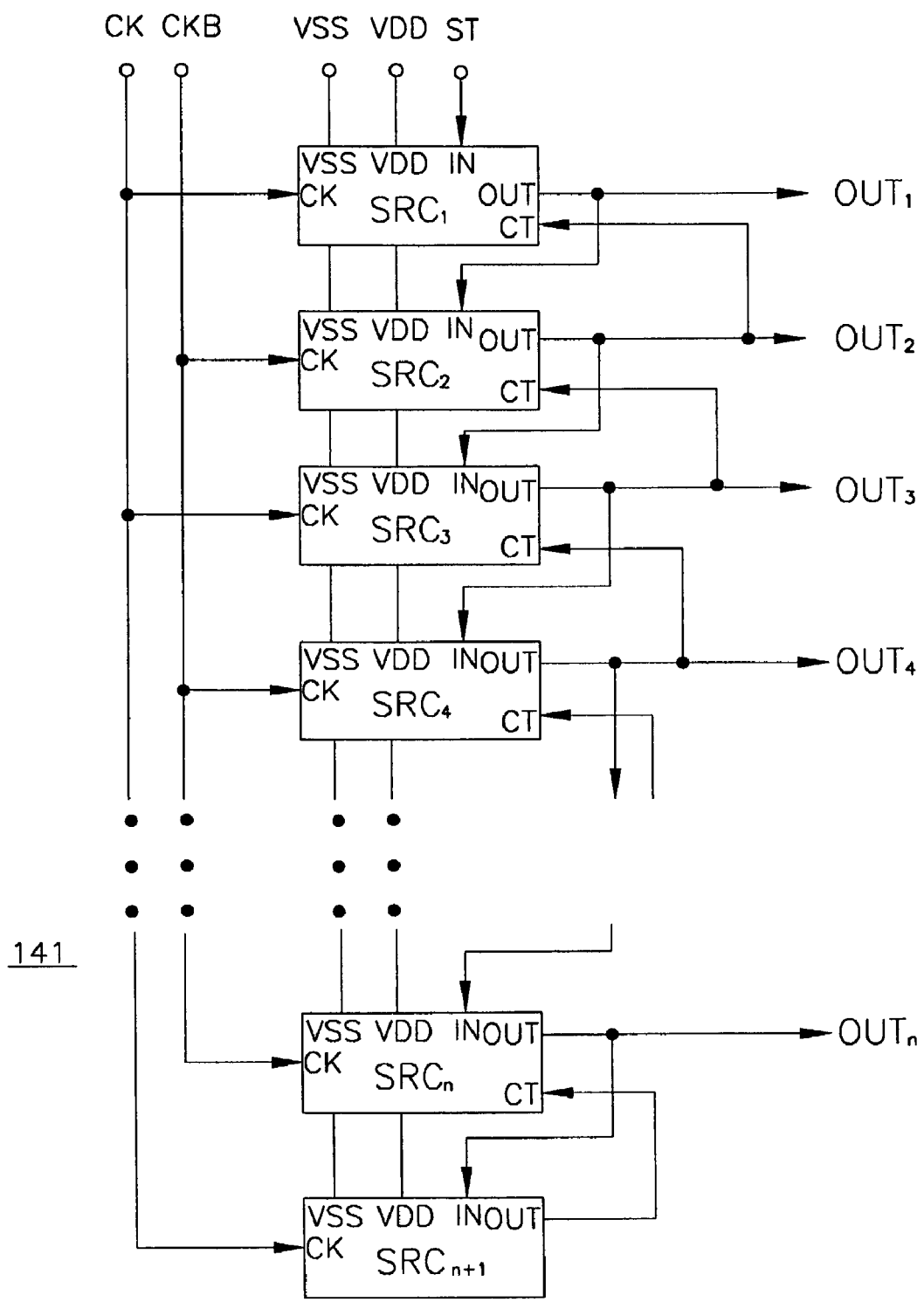
FIG. 14 is a block diagram of a first shift register in the gate driving circuit shown in FIG. 5, according to a first embodiment of the present invention.
Figure 15:
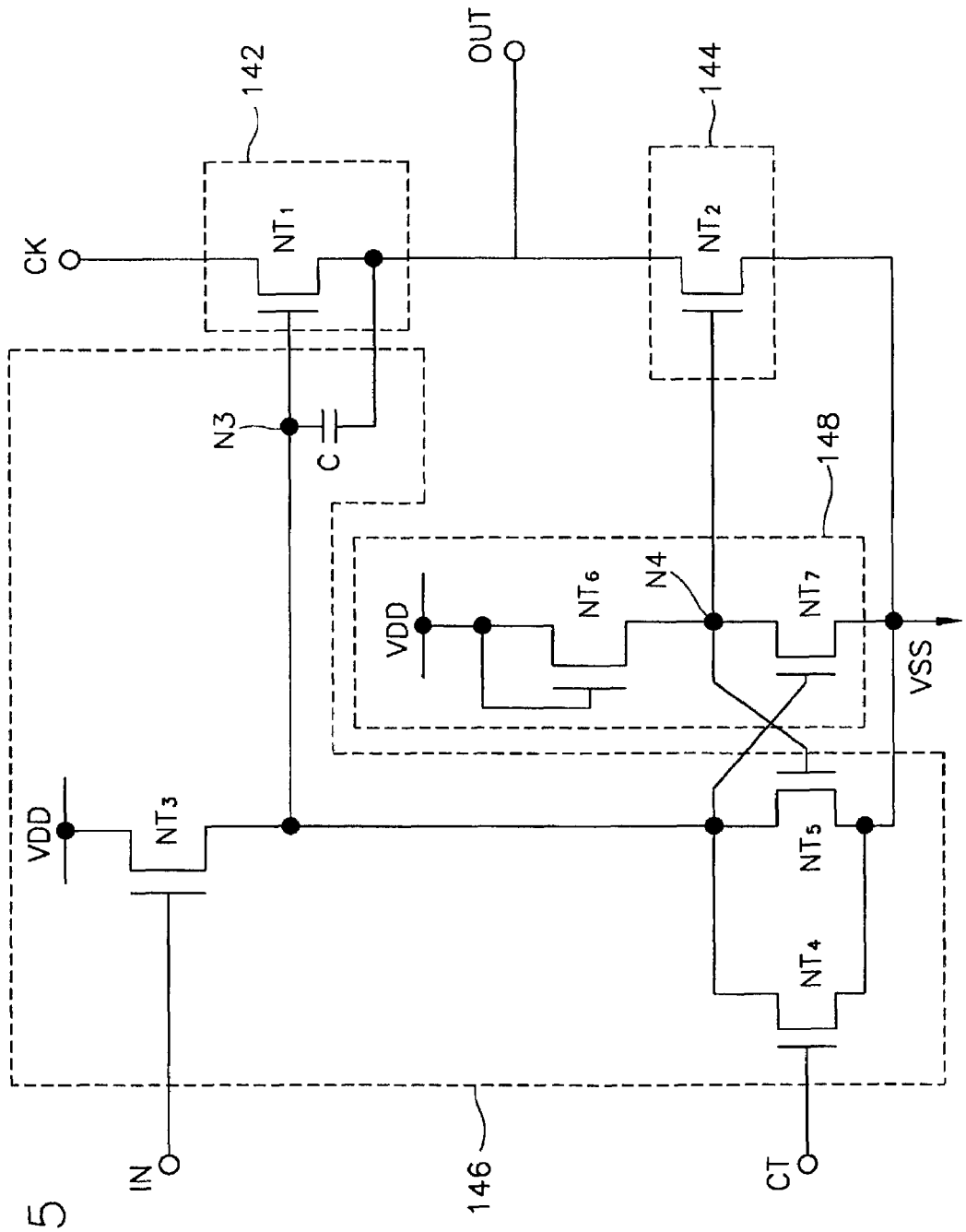
FIG. 15 is a detailed circuit diagram of the first shift register shown in FIG. 14.
Figure 16:
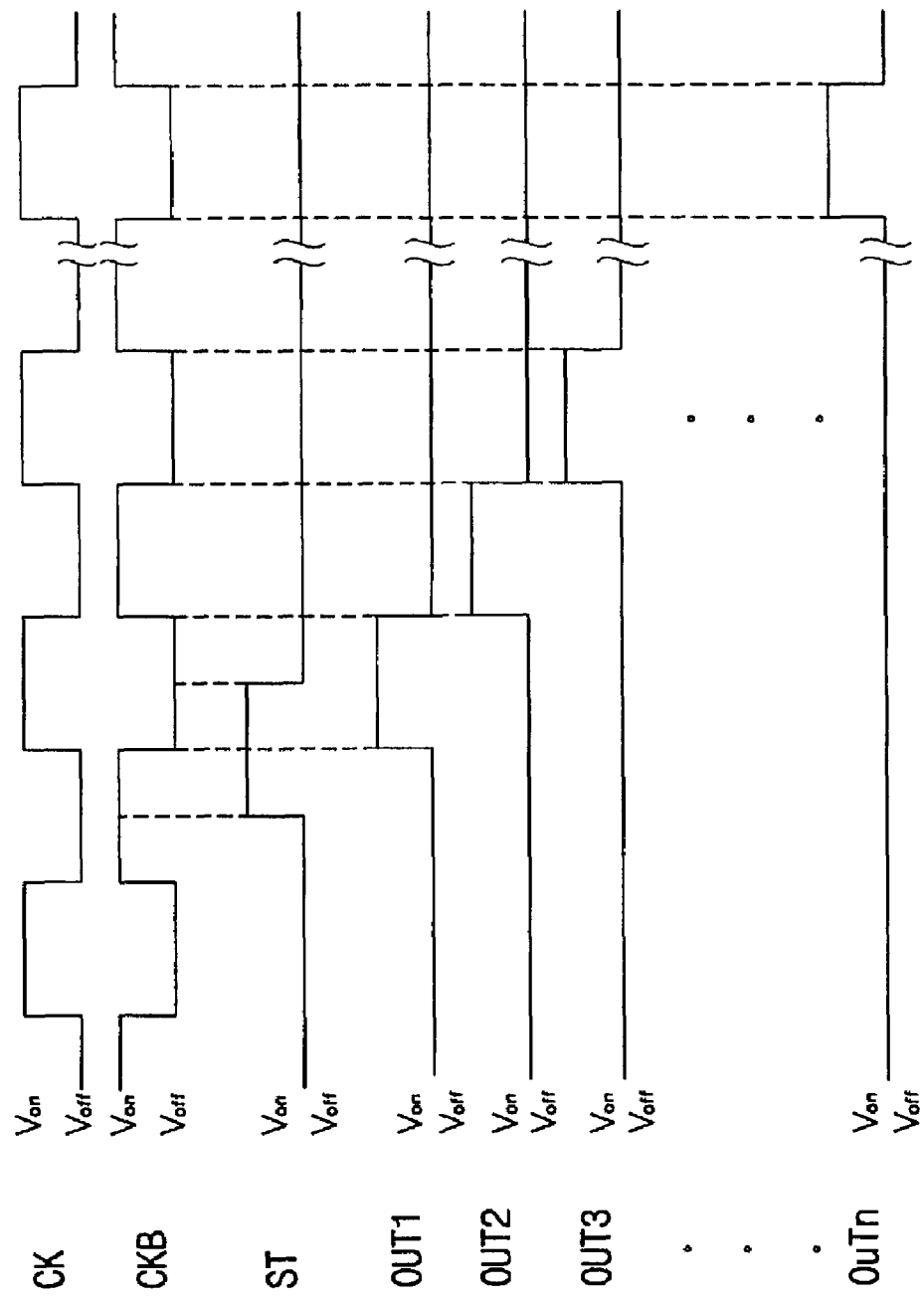
FIG. 16 is an output waveform of the first shift register shown in FIG. 14.

FIG. 14 is a block diagram of a first shift register in the gate driving circuit shown in FIG. 5 according to a first embodiment of the present invention, FIG. 15 is a detailed circuit diagram of each stage in the first shift register shown in FIG. 14, and FIG. 16 is an output waveform simulated at each stage shown in FIG. 15.

Referring to FIG. 14, the gate driving circuit 140 includes a first shift register 141 that includes a plurality of cascade-connected stages, designated SRC1 through SRCn. In other words, the output terminal OUT of each stage is connected to the input terminal of the next stage. The n stages of first shift register 141 correspond to the gate lines of GL1 to GLn, with the addition of one dummy stage SRCn+1. Each individual stage has an input terminal IN, an output terminal OUT, a control terminal CT, a clock signal input terminal CK, a first power voltage terminal VSS, and a second power voltage terminal VDD.

The input terminal IN of the first stage $SRC_1$ receives a start signal ST. The start signal ST is a pulse signal synchronized with the vertical synchronizing signal VSYN from the controller 181 shown in FIG. 5.

Each of the output terminals OUT1 through OUTn of the stages is connected to a corresponding gate line of GL1 through GLn. Odd numbered stages SRC1 and SRC3 receive the first clock signal CK, and even numbered stages SRC2 and SRC4 receive the second clock signal CKB. The first clock signal CK and the second clock signal CKB have a phase opposite to one another.

The output signals OUT2, OUT3 and OUT4 of the next stages SRC2, SRC3 and SRC4 are inputted to respective control terminals CT of the stages SRC1, SRC2 and SRC3, respectively, as a control signal. In other words, the control signal inputted to the control terminal CT is used to pull-down the output signal from the previous stage to a logic low level.

Thus, since the output signals of respective stages are sequentially generated within an active period of a logic high state, the gate lines corresponding to active periods of the respective output signals are selected.

Referring to FIG. 15, there is shown a circuit diagram illustrating an exemplary stage if the first shift register 141. As can be seen, each stage of the first shift register 141 includes a pull-up section 142, a pull-down section 144, a pull-up driving section 146, and a pull-down driving section 148.

The pull-up section 142 includes a first NMOS transistor NT1 having a drain connected to a clock signal input terminal, a gate connected to a third node N3, and a source connected to an output terminal OUT.

The pull-down section 144 includes a second NMOS transistor NT2 having a drain connected to an output terminal OUT, a gate connected to a fourth node N4, and a source connected to a first power voltage VSS.

The pull-up driving section 146 includes a capacitor C and NMOS transistors NT3, NT4 and NT5. The capacitor C is connected between the third node N3 and the output terminal OUT. A drain of the third NMOS transistor NT3 is connected to the second power voltage VDD, a gate of NT3 is connected to the input terminal IN, and a source of NT3 is connected to the third node N3. A drain of the fourth NMOS transistor NT4 is connected to the third node N3, a gate of NT4 is connected to control terminal CT, and a source of NT4 is connected to the first power voltage VSS. A drain of the fifth NMOS transistor NT5 is connected to the third node N3, a gate of NT5 is connected to the fourth node N4, and a source of NT5 is connected to the first power voltage VSS. The third NMOS transistor NT3, including the channel width thereof is about twice the size than that of the fifth NMOS transistor NT5.

The pull-down driving section 148 includes sixth and seven NMOS transistors NT6 and NT7. Both a drain and a gate of the sixth NMOS transistor NT6 are commonly connected to the second power voltage VDD, and a source of the NT6 is connected to the fourth node N4. A drain of the seventh NMOS transistor NT7 is connected to the fourth node N4, a gate of NT7 is connected to the third node N3, and a source of NT7 is connected to the first power voltage VSS. The sixth NMOS transistor NT6 has a size about sixteen times larger than that of the seven NMOS transistor NT7.

As shown in FIG. 16, when first and second clock signals CK and CKB, along with start signal ST, are supplied to the shift register 170, the first stage SRC1 delays the effect of the first clock signal CK transitioning to logic high for a predetermined time, until the rising edge of the start signal ST. Thereby, a delayed first output signal OUT1 is outputted through the output terminal OUT once CK goes from low to high, following ST going from low to high. Similarly, the second stage SRC2 delays the effect of the second clock signal CKB transitioning from low to high, until the rising edge of the first output signal OUT1 of the first stage SRC1. Thereby, a delayed second output signal OUT2 is outputted through the output terminal OUT. The first to the N-th output signals OUT1 to OUTn are thus sequentially generated through the output terminals OUT of the respective stages.

Figure 17:
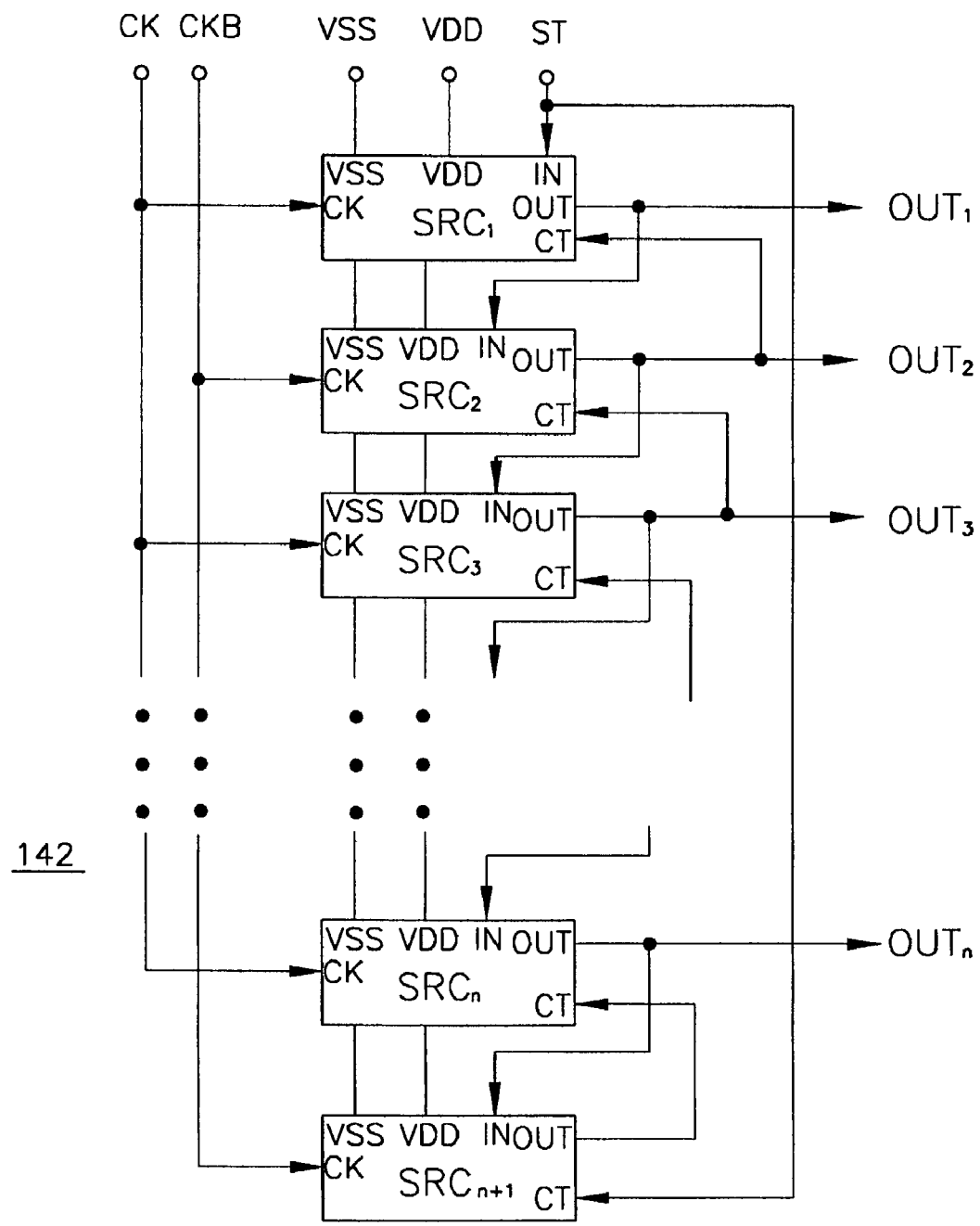
FIG. 17 is a block diagram of a second shift register in the gate driving circuit shown in FIG. 5, according to a second embodiment of the present invention.

FIG. 17 is a block diagram of a second shift register in the gate driving circuit shown in FIG. 5, according to a second embodiment of the present invention.

Referring to FIG. 17, the gate driving circuit 140 includes a second shift register 142 that includes a plurality of cascade-connected stages designated SRC1 through SRCn. In other words, the output terminal OUT of each stage is connected to the input terminal IN of the next stage. The second shift register 142 specifically includes n stages corresponding to the gate lines GL1 through GLn, and further includes one dummy stage SRCn+1. As each stage is sequentially operated for a frame period, the n gate lines GL1 through GLn are sequentially scanned.

The dummy stage SRCn+1 provides the control signal to the control terminal CT of the Nth stage SRCn, and operates as a last stage. However, since there is no next stage after the dummy stage, the dummy stage SRCn+1 would otherwise be in an unstable state because the control terminal CT of the dummy stage SRCn+1 remains in a floating state.

Thus, to prevent the dummy stage SRCn+1 from operating in an unstable state, the control terminal CT of the dummy stage SRCn+1 is connected to the start signal input terminal for receiving the start signal ST. That is, the dummy stage SRCn+1 receives the start signal ST as a control signal through the control terminal CT thereof.

In operation, when a logic high start signal is applied to the start signal input terminal of the first stage SRC1 (in order to execute a next frame after finishing a frame), the start signal is also applied to the control terminal CT of the dummy stage SRCn+1 as its control signal. In so doing, dummy stage SRCn+1 is prevented from operating in an unstable state by having the control terminal CT of the dummy stage SRCn+1 connected to the input terminal IN of the first stage SRC1. Also, as shown in FIG. 18, the control terminal CT of the dummy stage SRCn+1 may alternatively be connected to the previous stage SRCn in order to prevent the dummy stage SRCn+1 from operating in an unstable state.

Figure 18:
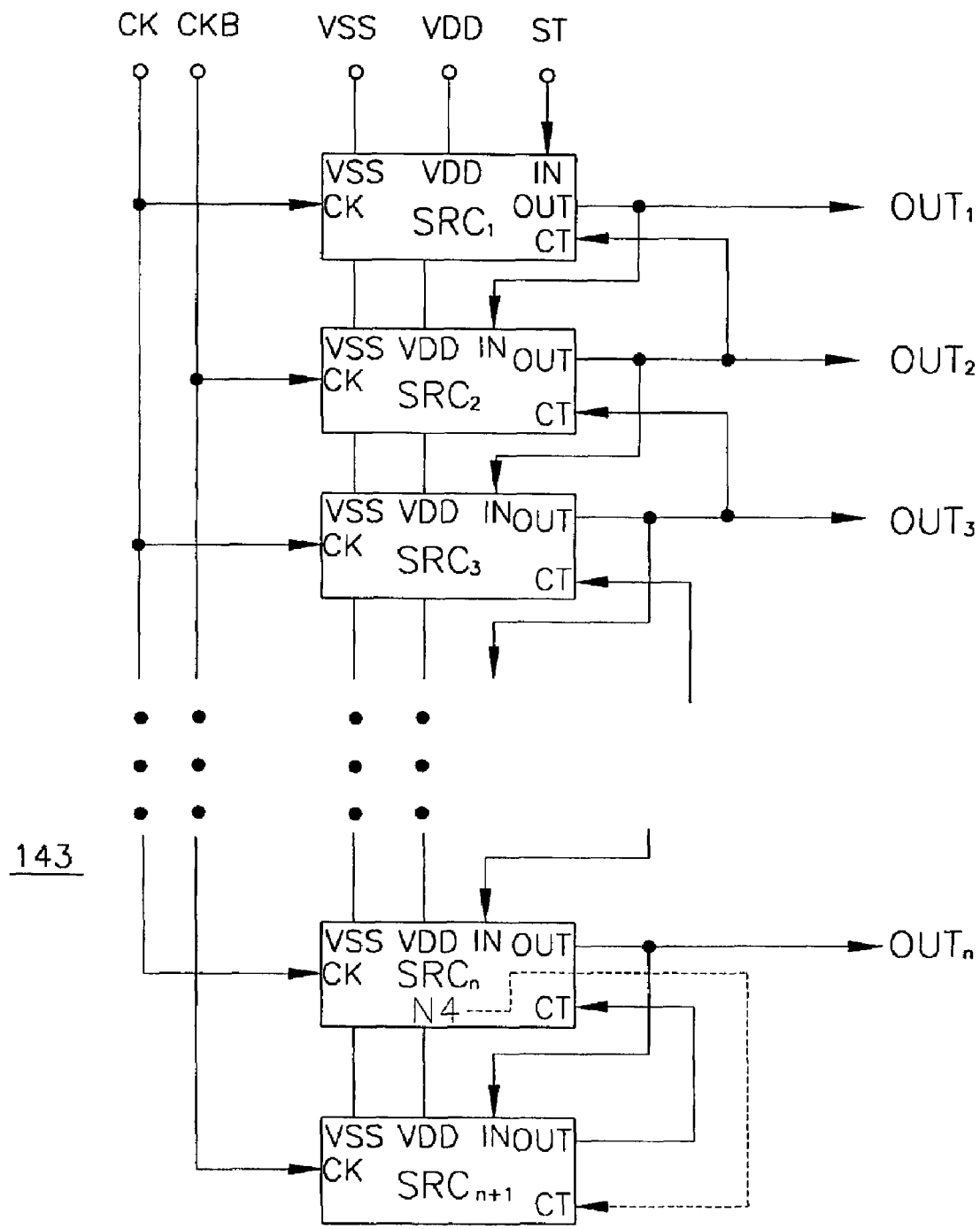
FIG. 18 is a block diagram of a third shift register in the gate driving circuit shown in FIG. 5, according to a third embodiment of the present invention.
Figure 19:
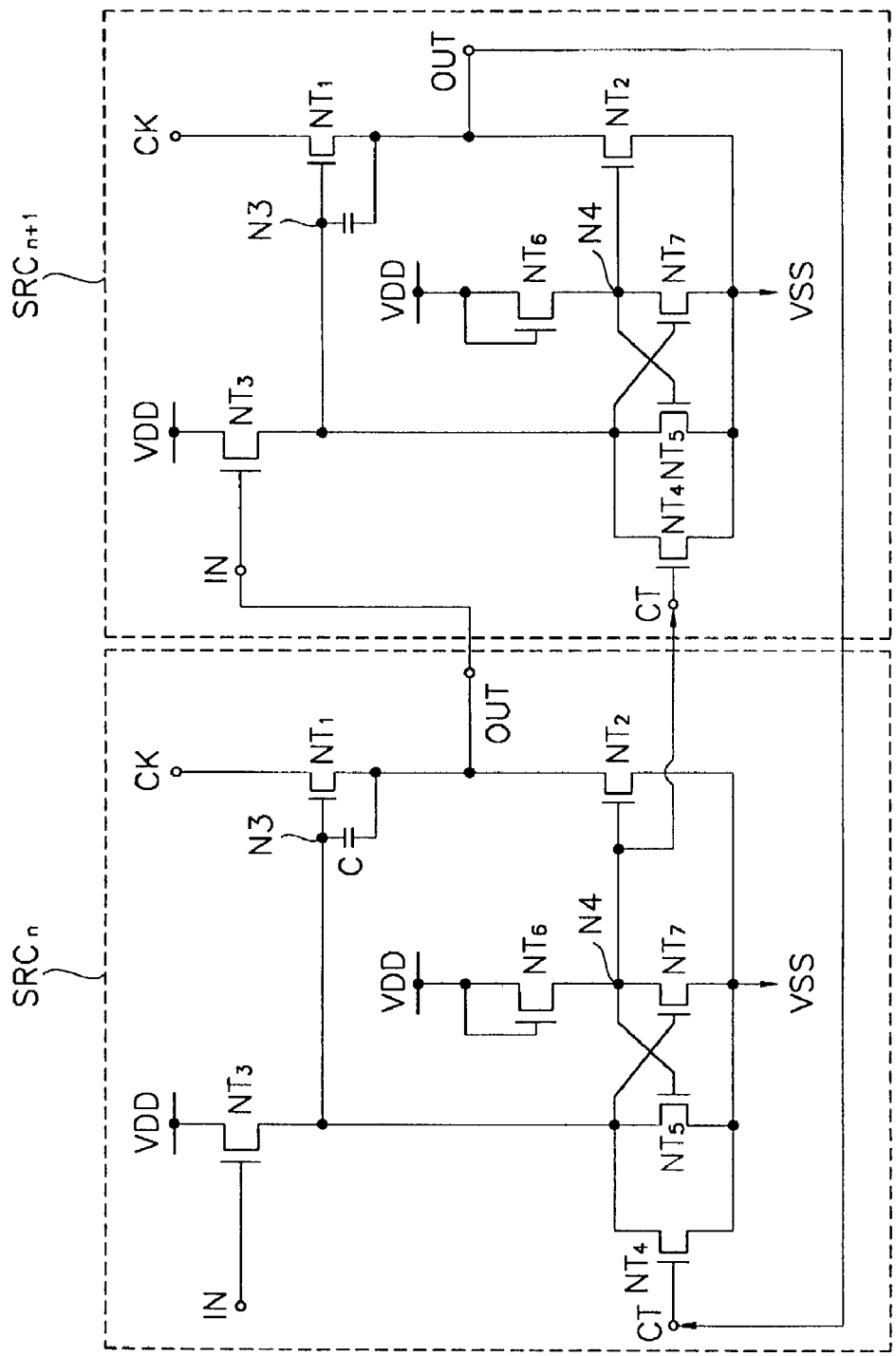
FIG. 19 is a circuit diagram of the third shift register shown in FIG. 18.

More specifically, FIG. 18 is a block diagram of a third shift register in the gate driving circuit shown in FIG. 5, according to a third embodiment of the present invention. FIG. 19 is a circuit diagram of the third shift register shown in FIG. 18.

Referring to FIG. 18, the gate driving circuit 140 includes a third shift register 143 that includes a plurality of cascade-connected stages SRC1 through SRCn. Again, the output terminal OUT of each stage is connected to both the input terminal IN of the next stage and the control terminal CT of the previous stage. The third shift register 143 includes n stages corresponding to gate lines GL1 through GLn, with the addition of dummy stage SRCn+1. The dummy stage SRCn+1 provides the control signal to the control terminal CT of the Nth stage SRCn, and operates as a last stage. However, since there is no next stage after the dummy stage, the control terminal CT of the dummy stage SRCn+1 is connected to the fourth node N4 of the Nth stage SRCn.

Hereinafter, the electric potential at the fourth node N4 will be described with reference to FIG. 19.

When the output signal of the previous stage is applied from the Nth stage SRCn to the input terminal IN of the next stage SRCn+1, NMOS transistor NT7 is turned on. Accordingly, the electric potential of the fourth node N4 is dropped down to the first power voltage VSS level.

Although NMOS transistor N7 is turned-on, the fourth node N4 maintains the first power voltage VSS because NMOS transistor N6 sixteen times larger than NMOS transistor N7. When the output signal (also supplied to the control terminal CT of the Nth stage SRCn) of the dummy stage SRCn+1 reaches a threshold voltage level, NMOS transistor NT7 is turned off. At that point, only the second power voltage VDD is supplied to the fourth node N4 through NMOS transistor NT6. Accordingly, the electric potential of the fourth node N4 increases from the first power voltage VSS level to the second power voltage VDD level.

When the output signal of the dummy stage SRCn+1 is dropped down to a low level, NMOS transistor NT4 is turned off. However, the fourth node N4 still has a bias voltage level at the second power voltage VDD because the second power voltage VDD is applied through the activated transistor NT6 to the fourth node N4.

The fourth node N4 is connected to the control terminal CT of the dummy stage SRCn+1, such that the fourth NMOS transistor N4 of the dummy stage SRCn+1 is turned on by means of the electric potential of the fourth node N4. Thus, a state of the output signal from the output terminal of the dummy stage SRCn+1 is changed into a turn-off voltage, and the dummy stage SRCn+1 is able to operate in a stable state.

Since the control terminal CT of the dummy stage SRCn+1 is connected to the fourth node N4 of the Nth stage SRCn, a separate line is not needed for electrically connecting the input terminal IN of the first stage SRC1 to the control terminal CT of the dummy stage SRCn+1.

Figure 20:
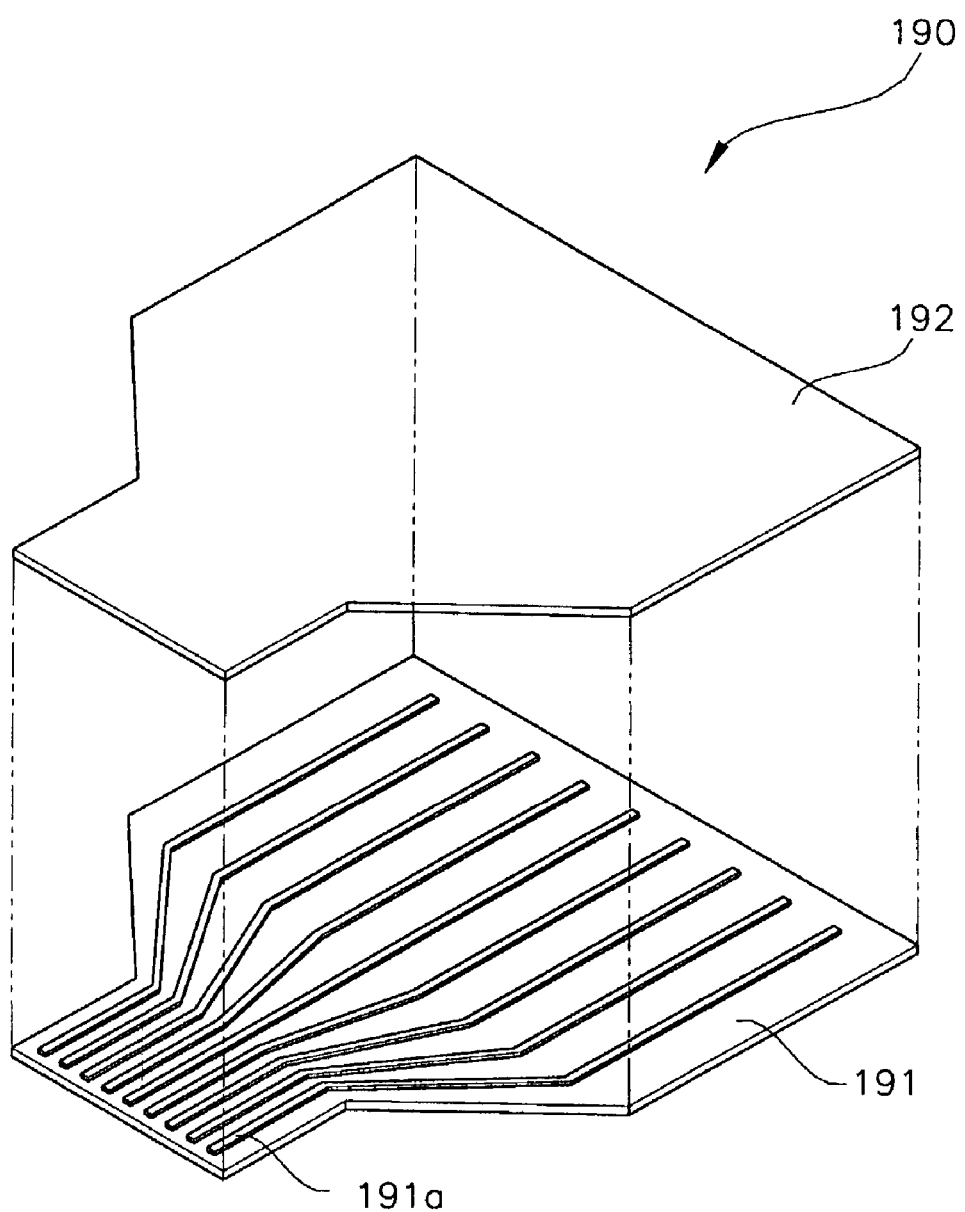
FIG. 20 is a perspective view showing a structure of an FPC shown in FIG. 3.

FIG. 20 is a perspective view showing an FPC having only one pattern layer shown in FIG. 3.

Referring to FIG. 20, the FPC 190 includes a circuit substrate separately disposed from the LCD panel 110 and a plurality of patterns that electrically connect the circuit substrate to the LCD panel 110. The FPC 190 executes an operation that provides the signal generated from the circuit substrate to the integrated driving chip 180.

The integrated driving chip 180 receives the external image data signal and the external control signal 181b. Particularly, the external control signal 181b includes the vertical and horizontal synchronizing signals VSYNC and HSYNC and the main clock signal MCLK.

When the integrated driving chip 180 is disposed in the LCD panel 110, the number of signals applied to the LCD panel 110 through the FPC decreases, thereby decreasing the number of patterns 191a to be formed in the FPC 190. Accordingly, the FPC 190 can be formed to have only one pattern layer.

The patterns 191a are formed on a first film 191 of the FPC 190, and are covered by means of a second film 192 facing the first film 191.

Figure 21:
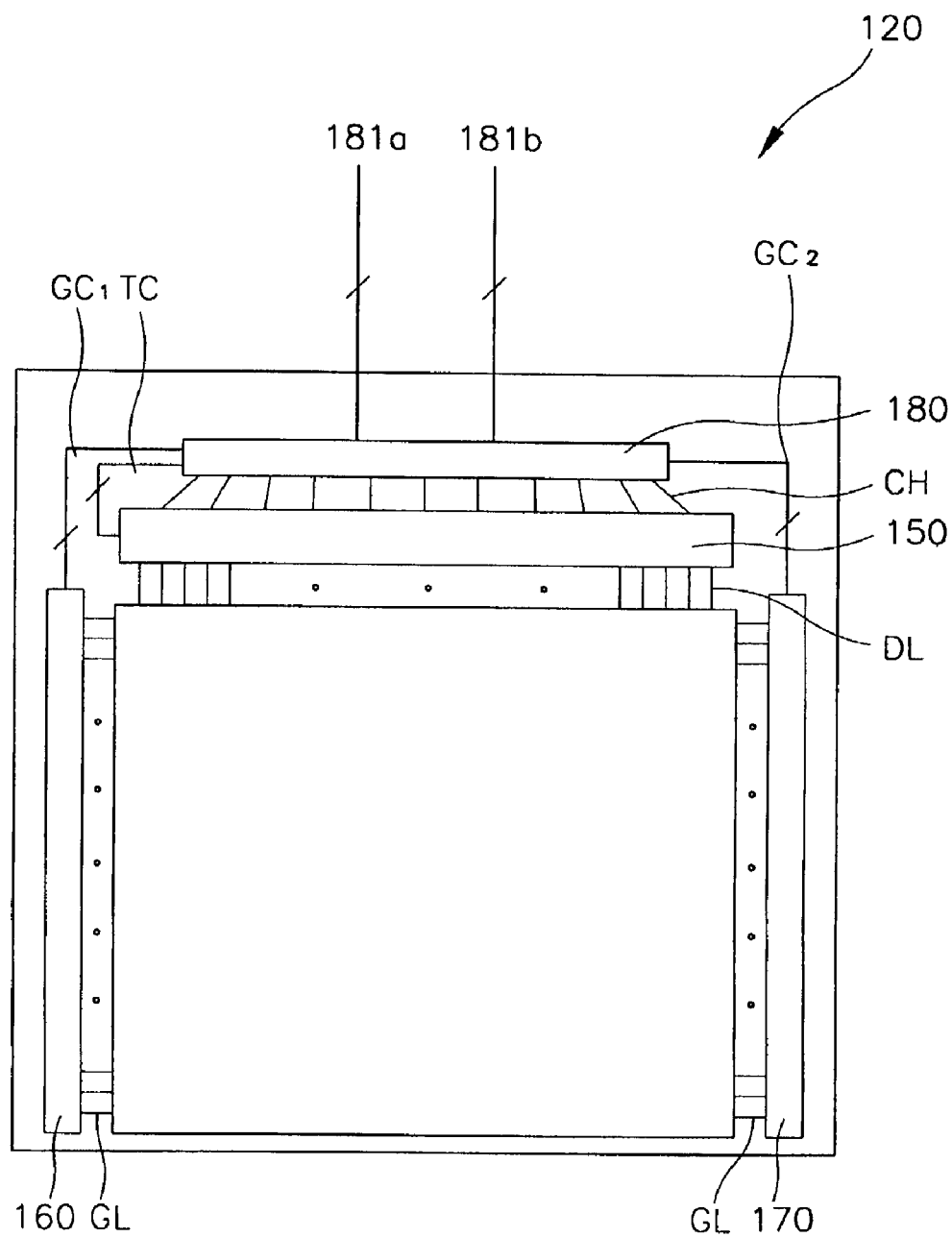
FIG. 21 is a schematic view showing an LCD panel according to another embodiment of the present invention.
Figure 22:
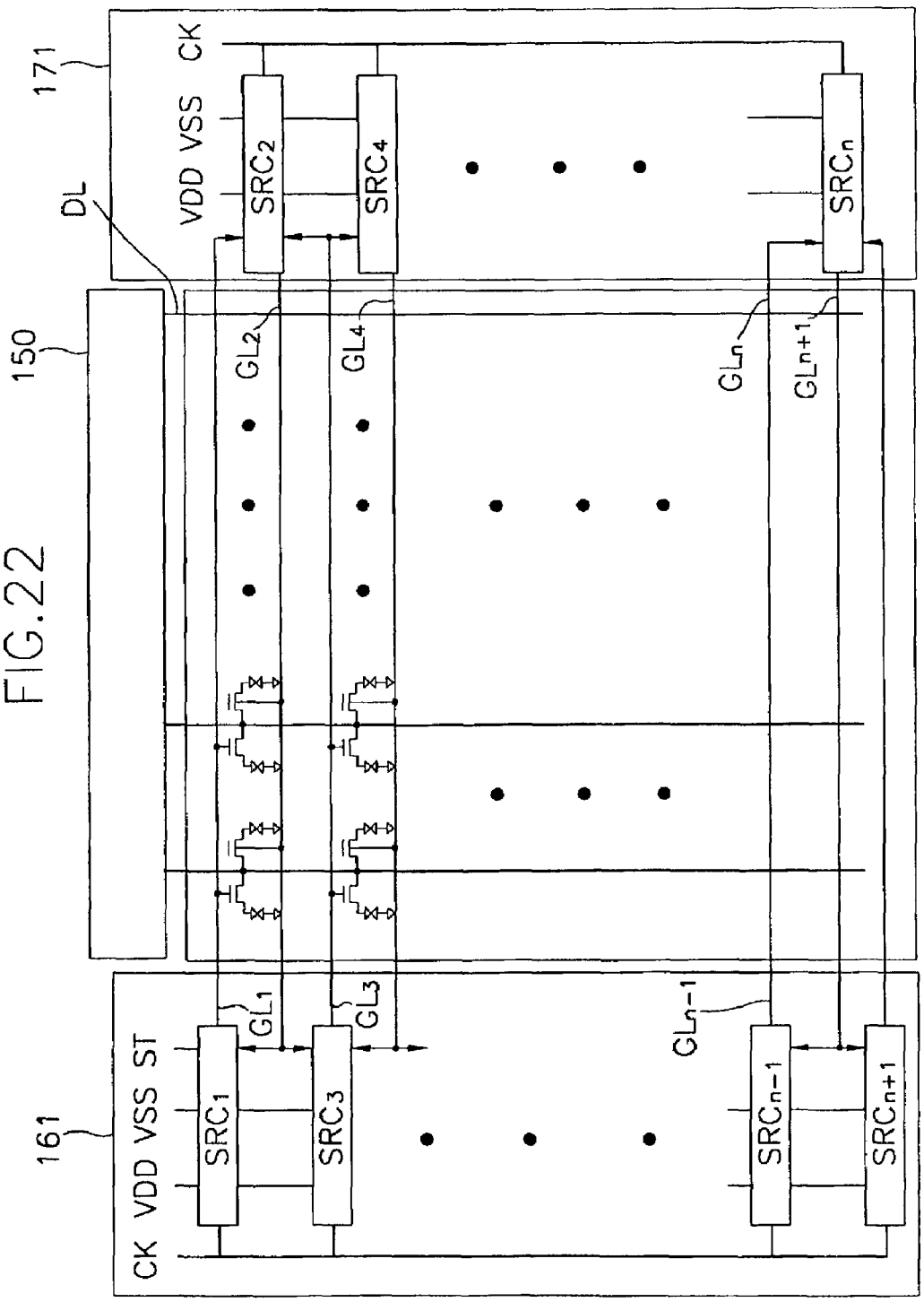
FIG. 22 is a block diagram of a fourth and a fifth shift registers of the first and second gate driving circuits shown in FIG. 21.
Figure 23:
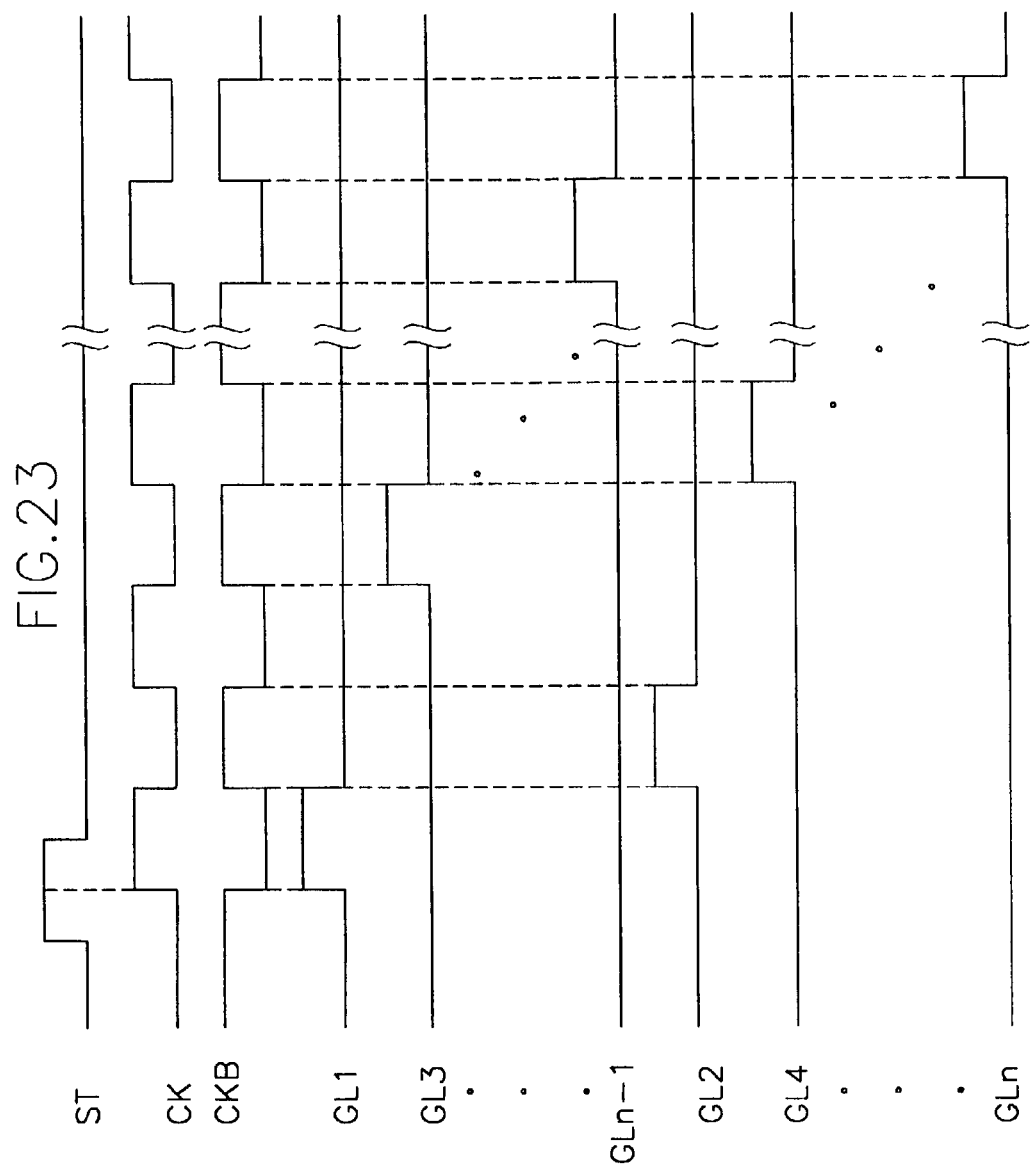
FIG. 23 is an output waveform of the fourth and fifth shift registers shown in FIG. 22.

FIG. 21 is a schematic view showing an LCD panel according to another embodiment of the present invention. FIG. 22 is a block diagram of fourth fifth shift registers of the first and second gate driving circuits shown in FIG. 21, and FIG. 23 is an output waveform of the shift register shown in FIG. 22.

Referring to FIG. 21, the TFT substrate 120 is divided into a first region corresponding to the color filter substrate 130, and a second region not corresponding to the color filter substrate 130. The first region includes a display region and a peripheral region adjacent to the display region. On the display region, there are arranged a plurality of data lines DL extended along the row direction, and a plurality of gate lines GL extended along the column direction. First and second gate driving circuits 160 and 170 are integrated in the left and right sides of the peripheral region, respectively. The first gate driving circuit 160, which is connected to the odd numbered gate lines of the plurality of gate lines GL, is disposed in the left side of the peripheral region. The second gate driving circuit 170, which is connected to the even numbered gate lines of the plurality of gate lines GL, is disposed in the right side of the peripheral region. On the upper side of the peripheral region adjacent to the display region, the line block selecting circuit 150 connected to the plurality of data lines is disposed.

In the second region of the TFT substrate 120, there is arranged the integrated driving chip 180 for controlling the operation of the LCD panel 110. The integrated driving chip 180 receives an external image data signal and an external control signal 181b from the external circuit substrate separately disposed from the LCD panel 110. The integrated driving chip 180 provides first and second driving control signals GC1 and GC2 that control the first and second gate driving circuit 160 and 170, respectively. The first and second driving control signals GC1, GC2 also provide an analog driving signal to each of the plurality of data lines DL.

Among the plurality of output terminals of the integrated driving chip 180, each of the output terminals for outputting the first and second driving control signals GC1 and GC2 is connected to corresponding input terminals of the first and second gate driving circuit 160 and 170. Further, an output terminal for outputting the line block selecting signal TG is connected to the control terminals of the line block selecting circuit 150. Each of the channel terminals CH is connected to corresponding input terminals of the line block selecting circuit 150, and each of the output terminals of the line block selecting circuit 150 is connected to corresponding data lines of the plurality of data lines DL.

In particular, the first driving control signal GC1 includes a start signal ST, a first clock signal CK, a first power voltage VOFF or VSS, and a second power voltage VON or VDD. The second driving control signal GC2 includes a second clock signal CKB, the first power voltage VOFF or VSS, and the second power voltage VON or VDD.

Referring to FIG. 22, the first gate driving circuit 160 includes a first shift register 161. The first shift register 161 is disposed in the left side of the peripheral region of the display region to which the odd numbered gate lines GL1 through GLn−1 are extended. Each of the output terminals OUT1 through OUTn−1 of the first shift register 161 is connected to the odd numbered gate lines GL1 through GLn−1. The second gate driving circuit 170 includes a second shift register 171. The second shift register 171 is disposed in the right side of the peripheral region of the display region to which the even numbered gate lines GL2 through GLn are extended. Each of the output terminals OUT2 through OUTn of the second shift register 171 is connected to the even numbered gate lines GL2 through GLn.

The output signal from an i-th stage SRCi of the first shift register 161 is applied to an input terminal INj of the j-th stage SRCj of the second shift register 171, which is disposed in the right side of the peripheral region, through the i-th gate line GLi. Simultaneously, the output signal from an i-th stage SRCi of the first shift register 161 is applied to a control terminal CTj−1 of the j−1th stage SRCj−1 as a control signal. Also, the output signal from a j-th stage SRCj of the second shift register 171 is applied to an input terminal INi+1 of the (i+1)-th stage SRCi+1 of the first shift register 161, and simultaneously applied to a control terminal CTi of the i-th stage SRCi of the first shift register 161 as a control signal. The last stage SRCn+1 of the first shift register 161 operates as a dummy stage, and provides the control signal to the control terminal CTn of the last stage SRCn.

Referring to FIG. 23, the odd numbered gate lines GL1 through GLn−1 and the even numbered gate lines GL2 through GLn are sequentially shifted by the start signal ST. Synchronized with the first and second clock signals CK and CKB, the odd numbered gate lines GL1 through GLn−1 and the even numbered gate lines GL2 through GLn are alternately scanned.

Among a plurality of pixels included in one horizontal line, each of the odd numbered pixels is operated by means of a corresponding gate line of the odd numbered gate lines GL1 through GLn−1, and each of the even numbered pixels is operated by means of a corresponding gate line of the even numbered gate lines GL2 through GLn.

Both gate lines GL1 and GL2 are operated simultaneously to drive the total number of pixels included in one horizontal line, thereby increasing the number of gate lines by two. Therefore, when the LCD panel 120 includes 160 horizontal lines, 320 gate lines are used to operate the 160 horizontal lines.

In accordance with above-described gate driving method, two horizontally adjacent TFT transistors in horizontal direction are commonly connected to a single data line, and are also connected to two lines separated from one another. Although the pixels are disposed in the same horizontal line, the odd numbered pixels are charged by means of the first gate driving circuit 160, and then the even numbered pixels are charged by means of the second gate driving circuit 170. The even numbered pixels are charged later than the odd numbered pixels by one clock cycle.

Figure 24:
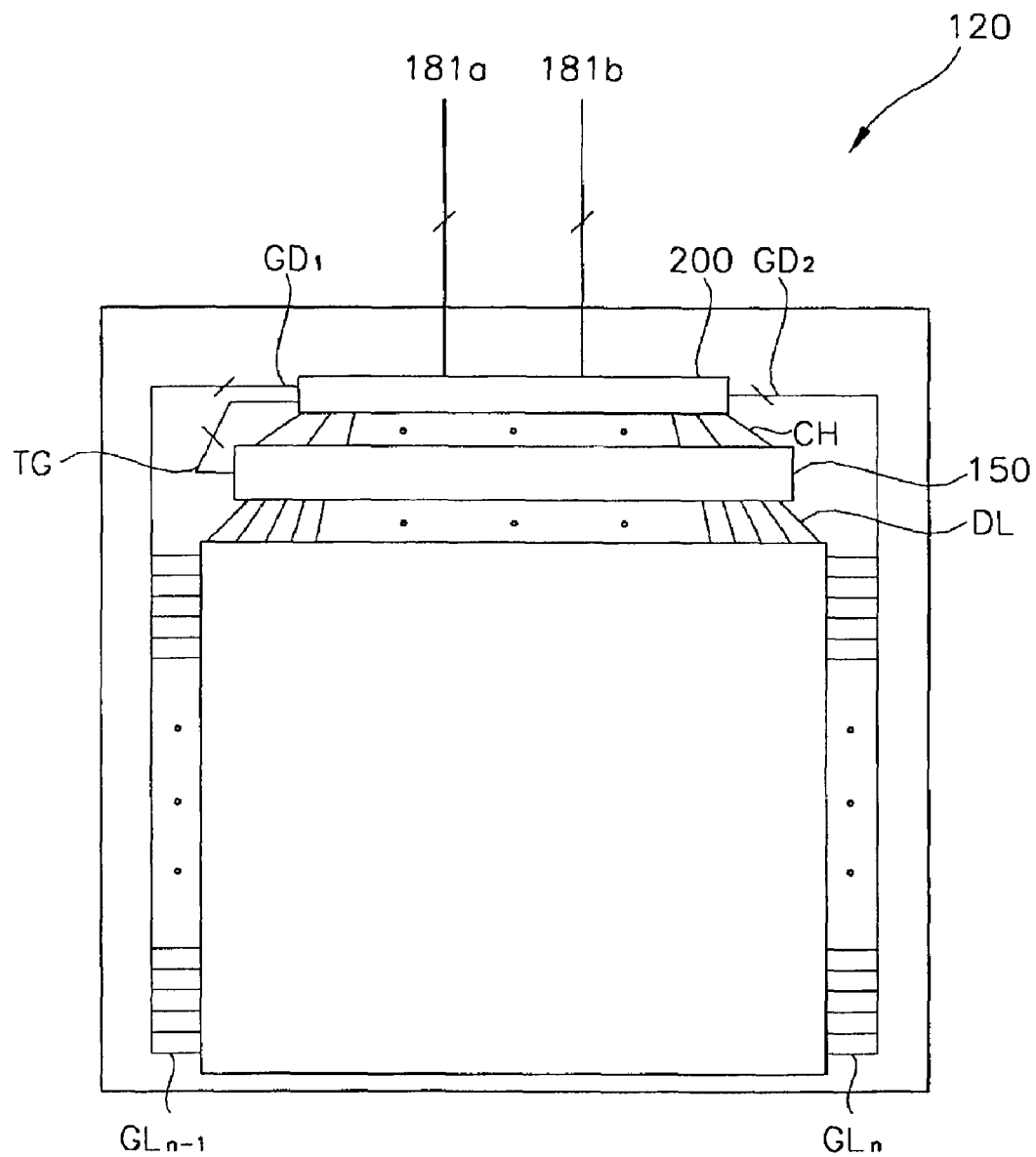
FIG. 24 is a schematic view showing an LCD panel according to another embodiment of the present invention.

FIG. 24 is a schematic view showing an LCD panel according to still another embodiment of the present invention.

Referring to FIG. 24, the TFT substrate 121 is divided into a first region corresponding to the color filter substrate 130 and a second region not corresponding to the color filter substrate 130. The first region includes the display region and the peripheral region adjacent to the display region. On the display region, there are arranged the plurality of data lines DL extended along the row direction, and a plurality of gate lines GL is extended along the column direction. A line block selecting circuit 150 is integrated in the upper side of the peripheral region adjacent to the display region to drive the plurality of data lines DL.

In the second region of the TFT substrate 120, an integrated driving chip 200 is arranged for controlling the operation of the LCD panel 110. Specifically, the integrated driving chip 200 receives the external image data signal and the external control signal 181b from the external circuit substrate separately disposed from the LCD panel 110. Then, the integrated driving chip 180 outputs the first gate driving signal GD1 to drive the odd numbered gate lines GLn−1 and the second gate driving signal GD2 to drive the even numbered gate lines GLn. Also, the integrated driving chip 180 provides analog driving signals to the plurality of data lines DL, respectively.

Each of the output terminals for outputting the first gate driving signal GD1 in the integrated driving chip 200 is connected to a corresponding gate line of the odd numbered gate lines GLn−1, and each of the output terminals for outputting the second gate driving signal GD2 is connected to a corresponding gate line of the even numbered gate lines GLn. Each of channel terminals CH of the integrated driving chip 200 is connected to corresponding input terminals of the line block selecting circuit 150, and the selecting signal TG outputted from the integrated driving chip 200 is applied to the line block selecting circuit 150.

Figure 25:
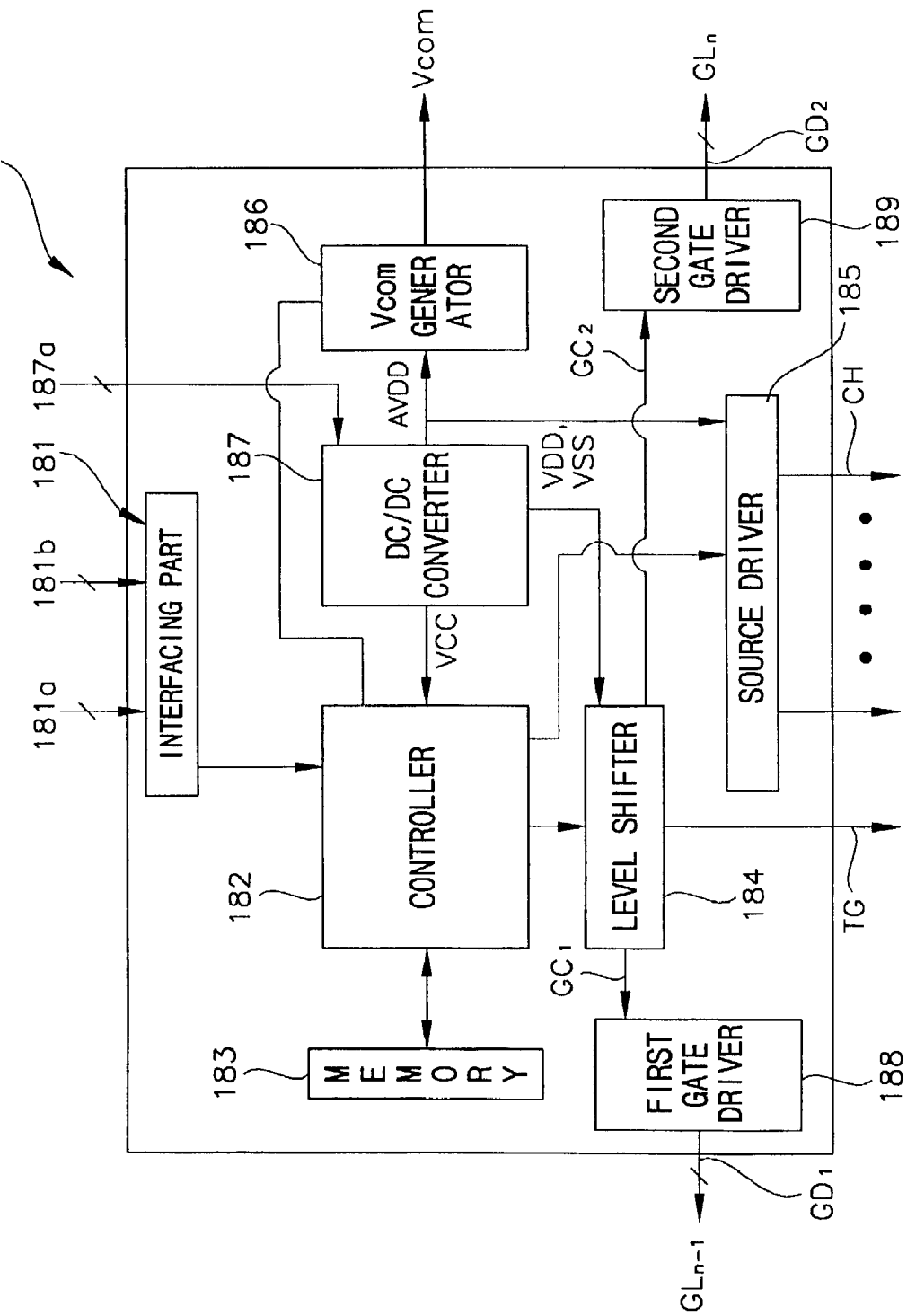
FIG. 25 is a block diagram showing an integrated driving chip shown in FIG. 24.

FIG. 25 is a block diagram showing an integrated driving chip shown in FIG. 24. Hereinafter, elements performing the same functions with the elements shown in FIG. 7 have the same reference numerals as that of FIG. 7, and wherein the function of the elements is not illustrated.

Referring to FIG. 25, the integrated driving chip 200 includes an interfacing part 181, a memory 183, a source driver 185, a level shifter 184, a first gate driver 188, a second gate driver 189, and a controller 182.

The controller 182 provides the first and second driving control signals GC1 and GC2, as well as the line block selecting signal TG to the level shifter 184. The first and second driving control signals GC1 and GC2 include a start signal ST, a first clock signal CK, a second clock signal CKB, a first power voltage VSS, and a second power voltage VDD.

The level shifter 184 shifts the level of the first and second driving control signals GC1 and GC2, and provides the level-shifted first and second driving control signals GC1 and GC2 to the first and second gate driver 188 and 189.

The first gate driver 188 outputs a first gate driving signal GD1 in response to the first driving control signal GC1, thereby driving the odd numbered gate lines GLn−1 by means of the first gate driving signal GD1. Also, the second gate driver 189 outputs the second gate driving signal GD2 in response to the second driving control signal GC2, thereby driving the even numbered gate lines GLn by means of the second gate driving signal GD2.

Further, the integrated driving chip 200 includes a common voltage generator 186 and a DC/DC converter 187. The common voltage generator 186 generates common voltage and supplies the common voltage to the common electrode line formed on the LCD panel 110. The DC/DC converter 187 receives a DC power voltage 187a from an external source (not shown), converts a level of the DC power voltage 187a, and supplies the converted DC power 187a to a controller 182, a level shifter 184, a source driver 185 and common voltage generator 186, respectively.

While the invention has been described above with reference to the aforementioned embodiments, it will be appreciated that many alternative modifications and variations will be apparent to those having skills in the art in light of the foregoing description. Accordingly, the present invention embodiments embrace all such alternative modifications and variations as fall within the spirit and scope of the appended claims.

What is claimed is:

1. A liquid crystal display apparatus comprising:
a first substrate having a display region and a peripheral region adjacent to the display region;
a second substrate facing the first substrate; and
a liquid crystal interposed between the first and second substrates, wherein the first substrate further comprises:
a plurality of switching devices formed in the display region in a matrix;
a plurality of pixel electrodes formed in the display region in the matrix, each of the plurality of pixel electrodes being connected to a first current electrode of each switching device of the plurality of switching devices;
a plurality of gate lines arranged in a row, each of the plurality of gate lines being commonly connected to control electrodes of switching devices arranged in the row among the plurality of switching devices;
a plurality of data lines arranged in a column, each of the plurality of data lines being commonly connected to second current electrodes of switching devices arranged in the column among the plurality of switching devices;
a gate driving circuit, formed in a first region of the peripheral region to which first ends of the plurality of gate lines are extended, for sequentially scanning the plurality of gate lines; and
an integrated driving chip, directly attached to a second region of the peripheral region to which first ends of the plurality of data lines are extended, for providing a driving control signal to the gate driving circuit in response to an external image data and an external control signal, and providing an analog signal to the plurality of data lines, respectively, each analog signal provided to the plurality of data lines from the integrated driving chip is commonly connected to at least two adjacent data lines of the plurality of data lines,
wherein the first region of the peripheral region corresponds to the second substrate, and the second region of the peripheral region does not correspond to the second substrate,
the driving control signal comprises a start signal, a first clock signal and a second clock signal,
the gate driving circuit comprises a shift register including cascade-connected plural stages, the plural stages having a first stage in which the start signal is applied to an input terminal of the first stage, and wherein the shift register sequentially selects the plural gate lines using an output signal outputted from an output terminal of each stage,
each stage further comprises:
an input terminal connected to a gate line connected to the output terminal of a previous stage;
the output terminal connected to a corresponding gate line;
a control terminal connected to a gate line connected to the output terminal of a next stage;
a clock terminal into which a corresponding clock signal is inputted;
a pull-up unit configured to provide a corresponding clock signal of the first and second clock signals to the output terminal;
a pull-down unit configured to provide a first power voltage to the output terminal;
a pull-up driving unit, configured to an input node of the pull-up unit, the pull-up driving unit being configured to turn on the pull-up unit by means of charging a capacitor in response to a rising edge of an input signal inputted from the input terminal, turn off the input unit by means of discharging the capacitor in response to a rising edge of a driving signal, which is inputted from the control terminal, and drive the gate line connected to the next stage; and
a pull-down driving unit, connected to an input node of the pull-down unit and connected to the input node of the pull-up unit, the pull-down driving unit being configured to turn off the pull-down unit, and turn on the pull-down unit in response to the rising edge of the driving signal for driving the gate line connected to the next stage.

2. The apparatus of claim 1, wherein a control terminal of a last stage of the shift register is connected to the input terminal of the first stage.

3. The apparatus of claim 1, wherein a control terminal of a last stage of the shift register is connected to the input node of the pull-down unit of the previous stage.

4. The liquid crystal display apparatus of claim 1, wherein a number of data lines is greater than a number of channel terminals of the integrated driving chip.

5. The liquid crystal display apparatus of claim 1, wherein the integrated driving chip is further directly attached to the first end of the plurality of data lines of the first substrate.

6. The liquid crystal display of apparatus of claim 1, wherein the second region corresponds to an outside of the second substrate.

7. The liquid crystal display apparatus of claim 1, wherein the integrated driving chip directly provides the analog signal to the data lines.

8. The liquid crystal display apparatus of claim 1, wherein the pull-up unit comprises one transistor.

9. The liquid crystal display apparatus of claim 1, wherein the pull-down unit comprises one transistor.

10. A liquid crystal display apparatus comprising:
a first substrate having a display region and a peripheral region adjacent to the display region;
a second substrate facing the first substrate; and
a liquid crystal interposed between the first and second substrates,
wherein the first substrate further comprises:
a plurality of switching devices formed in the display region in a matrix;
a plurality of pixel electrodes formed in the display region in the matrix, each of the plurality of pixel electrodes being connected to a first current electrode of each switching device of the plurality of switching devices;
a plurality of gate lines arranged in a row, each of the plurality of gate lines being commonly connected to control electrodes of switching devices arranged in the row among the plurality of switching devices;
a plurality of data lines arranged in a column, each of the plurality of data lines being commonly connected to second current electrodes of switching devices arranged in the column among the plurality of switching devices;
a gate driving circuit, formed in a first region of the peripheral region to which first ends of the plurality of gate lines are extended, for sequentially scanning the plurality of gate lines;
a line block selecting circuit, formed in a second region of the peripheral region to which first ends of the plurality of data lines are extended, for receiving analog driving signals of block-units, selecting one of line blocks of the plurality of data lines, and switching the analog driving signals of a block-unit to data lines of the selected line block; and
an integrated driving chip, directly attached to the second region, for providing driving control signals to the gate driving circuit in response to an external image data and external control signals, and providing a line block selecting signals and the analog signals of a block-unit to the line block selecting circuit, each analog signal provided to the plurality of data lines form the integrated driving chip is commonly connected to at least two adjacent data lines of the plurality of data lines, wherein the first region of the peripheral region corresponds to the second the driving control signal comprises a start signal, a first clock signal and a second clock signal, the gate driving circuit comprises a shift register including cascade-connected plural stages, the plural stages having a first stage in which the start signal is applied to an input terminal of the first stage, and wherein the shift register sequentially selects the plural gate lines using an output signal outputted from an output terminal of each stage, each stage further comprises:

an input terminal connected to a gate line connected to the output terminal of a previous stage;

the output terminal connected to a corresponding gate line;

a control terminal connected to a gate line connected to the output terminal of a next stage;

a clock terminal into which a corresponding clock signal is inputted;

a pull-up unit configured to provide a corresponding clock signal of the first and second clock signals to the output terminal;

a pull-down unit configured to provide a first power voltage to the output terminal;

a pull-up driving unit, configured to an input node of the pull-up unit, the pull-up driving unit being configured to turn on the pull-up unit by means of charging a capacitor in response to a rising edge of an input signal inputted from the input terminal, turn off the pull-up unit by means of discharging the capacitor in response to a rising edge of a driving signal, which is inputted from the control terminal, and drive the gate line connected to the next stage; and a pull-down driving unit, connected to an input node of the pull-down unit and connected to the input node of the pull-up unit, the pull-down driving unit being configured to turn off the pull-down unit, and turn on the pull-down unit in response to the rising edge of the driving signal for driving the gate line connected to the next stage.

11. The apparatus of claim 10, wherein the integrated driving chip comprises:

an interfacing part for interfacing the external image data and the external control signals;

a memory for storing the external image data;

a source driver for outputting the analog driving signals of block-units in response to image data of block-unit read out from the memory block by block;

a level shifter for shifting a level of the driving control signals and the line block selecting signals; and a controller for storing the external image data into the memory in response to the external control signals inputted from the interfacing part, generating the driving control signals and the line block selecting signal, providing the driving control signals and the line block selecting signal to the level shifter, reading out image data block by block from the memory, and providing the image data read out block by block to the source driver.

12. The apparatus of claim 11, wherein the memory stores the external image data signal frame by frame.

13. The apparatus of claim 11, wherein the memory stores the external image data signal by two lines.

14. The apparatus of claim 11, wherein the interfacing part is compatible with a CPU interface, a video graphic board interface and a media-Q interface.

15. The apparatus of claim 11, wherein the integrated driving chip further comprises:

a common voltage generator for generating a common voltage, and providing the common voltage to common electrode lines formed on a liquid crystal panel; and a DC/DC converter for receiving a external voltage, converting the external voltage, and providing the converted external voltage to the controller, the level shifter, the source driver and the common voltage generator.

16. The apparatus of claim 10, wherein the external image data has 18 bits parallel data in total, the 18 bits data including 6 bits to each of red, green and blue, and wherein the external control signals include a main clock signal, a horizontal synchronizing signal, a vertical synchronizing signal and a data enable signal.

17. The apparatus of claim 16, wherein the external control signals further comprise a mode selecting signal, and wherein the controller generates the line block selecting signal in response to the mode selecting signal.

18. The apparatus of claim 10, wherein the block has a size corresponding to one selected from the group consisting of $1/1$, $1/2$, $1/3$ and $1/4$ of a horizontal resolution.

19. The apparatus of claim 18, wherein a first line block comprises odd numbered data lines and a second line block comprises even numbered data lines when the block has the size corresponding to $1/2$ of the horizontal resolution.

20. The apparatus of claim 19, wherein the line block selecting circuit comprises:

a plurality of first selecting transistors, each of first current electrodes of the first selecting transistors connected to a corresponding first output terminal of first output terminals outputting the analog driving signals of the integrated driving chip, each of second current electrodes connected to a corresponding odd numbered data line of the odd numbered data lines, and each of control electrodes connected to a corresponding second output terminal of second output terminals outputting the first line block selecting signals; and a plurality of second selecting transistors, each of first current electrodes connected to the corresponding first output terminal of the first output terminals, each of second current electrodes connected to a corresponding even numbered data line of the even numbered data lines, and each of control electrodes connected to a corresponding third output terminal of third output terminals outputting the second line block selecting signals.

21. The apparatus of claim 18, wherein a first line block comprises (3n−2) number data lines, a second line block comprises (3n−1) number data lines, and a third line block comprises (3n) number data lines when the block has the size corresponding to $1/3$ of the horizontal resolution, wherein n is an integer.

22. The apparatus of claim 21, wherein the line block selecting circuit comprises:

a plurality of first selecting transistors, each of first current electrodes of the first selecting transistors connected to a corresponding first output terminal of first output terminals outputting the analog driving signals of the integrated driving chip, each of second current electrodes connected to a corresponding (3n−2) number data line of the (3n−2) number data lines, and each of control electrodes connected to a corresponding second output terminal of second output terminals outputting the first line block selecting signals; and a plurality of second selecting transistors, each of first current electrodes connected to the corresponding first output terminal of the first output terminals, each of second current electrodes connected to a corresponding (3n−1) number data line of the (3n−1) number data lines, and each of control electrodes connected to a corresponding third output terminal of third output terminals outputting the second line block selecting signals; and a plurality of third selecting transistors, each of first current electrodes connected to the corresponding first output terminal of the first output terminals, each of second current electrodes connected to a corresponding (3n) number data line of the (3n) number data lines, and each of control electrodes connected to a corresponding fourth output terminal of fourth output terminals outputting the third line block selecting signals.

23. The apparatus of claim 10, wherein the pull-up driving unit comprises:

the capacitor connected between the input node of the pull-up unit and the output terminal;

a first transistor, a drain of which is connected to a second power voltage, a gate of which is connected to the input terminal, and source of which is connected to the input node of the pull-up unit;

a second transistor, a drain of which is connected to the input node of the pull-up unit, a gate of which is connected to the control terminal, and a source of which is connected to the first power voltage; and a third transistor, a drain of which is connected to the input node of the pull-up unit, a gate of which is connected to the input node of the pull-down unit, and a source of which is connected to the first power voltage.

24. The apparatus of claim 10, wherein the pull-down driving unit comprises:

a fourth transistor, a drain and gate of which is connected to the second power voltage, and a source of which is connected to the input node of the pull-down unit; and a fifth transistor, a drain of which is connected to the input node of the pull-down unit, a gate of which is connected to the input node of the pull-up unit, and a source of which is connected to the first power voltage.

25. The apparatus of claim 10, wherein a control terminal of a last stage of the shift register is connected to the input terminal of the first stage 26. The apparatus of claim 10, wherein a control terminal of a last stage of the shift register is connected to the input node of the pull-down unit of the previous stage.

27. The apparatus of claim 10, further comprising a flexible printed circuit board having a pattern, the pattern being connected to the first substrate for providing the external image data and the external control signals to the integrated driving chip.

28. The liquid crystal display apparatus of claim 10, wherein the number of the data lines is smaller than a number of the gate lines.

29. The liquid crystal display apparatus of claim 10, wherein a number of the data lines is greater than a number of channel terminals of the integrated driving chip.

30. The liquid crystal display apparatus of claim 10, wherein the integrated driving chip is further directly attached to the line block selecting circuit of the first substrate.

31. The liquid crystal display apparatus of claim 30, wherein the line block selecting circuit is further directly attached to the first ends of the plurality of data lines of the first substrate.

32. The liquid crystal display apparatus of claim 10, wherein the pull-up unit comprises one transistor.

33. The liquid crystal display apparatus of claim 10, wherein the pull-down unit comprises one transistor.

34. A liquid crystal display apparatus comprising:

a first substrate having a display region and a peripheral region adjacent to the display region;

a second substrate facing the first substrate; and a liquid crystal interposed between the first and second substrates, wherein the first substrate further comprises:

a plurality of switching devices formed in the display region in a matrix;

a plurality of pixel electrodes formed in the display region in the matrix, each of the plurality of pixel electrodes being connected to a first current electrode of each switching device of the plurality of switching devices;

a plurality of gate lines arranged in a row, each of the plurality of gate lines being commonly connected to control electrodes of switching devices arranged in the row among the plurality of switching devices;

a plurality of data lines arranged in a column, each of the plurality of data lines being commonly connected to second current electrodes of switching devices arranged in the column among the plurality of switching devices;

a first gate driving circuit, formed in a first region of the peripheral region to which first ends of the plurality of gate lines are extended, for driving odd numbered gate lines of the plurality of gate lines;

a second gate driving circuit, formed in a second region of the peripheral region to which second ends of the plurality of gate lines are extended, for driving even numbered gate lines of the plurality of gate lines, and connected to the first gate driving circuit through the plurality of gate lines in order to sequentially scan the plurality of gate lines;

a line block selecting circuit formed in a third region of the peripheral region to which first ends of the plurality of data lines are extended, for receiving analog driving signals of block-units, selecting one of line blocks of the plurality of data lines, and switching the analog driving signals of a block-unit to data lines of the selected line block; and an integrated driving chip, directly attached to the third region, for providing driving control signals to the first and second gate driving circuits in response to an external image data and external control signals, and providing a line block selecting signals and the analog signals of a block-unit to the line block selecting circuit, each analog signal provided to the plurality of data lines from the integrated driving chip is commonly connected to at least two adjacent data lines of the plurality of data lines, wherein the first and second regions of the peripheral region corresponds to the second substrate, and the third region of the peripheral region does not correspond to the second substrate, the driving control signals comprises a start signal, a first clock signal and a second clock signal, each of the first and second the gate driving circuits comprises a shift register including cascade-connected plural stages, the plural stages having a first stage in which the start signal is applied to an input terminal of the first stage, and wherein the shift register sequentially selects the plural gate lines using an output signal outputted from an output terminal of each stage, each stage further comprises:

an input terminal connected to a gate line connected to the output terminal of a previous stage;

the output terminal connected to a corresponding gate line;

a control terminal connected to a gate line connected to the output terminal of a next stage;

a clock terminal into which a corresponding clock signal is inputted;

a pull-up unit configured to provide a corresponding clock signal of the first and second clock signals to the output terminal;

a pull-down unit configured to provide a first power voltage to the output terminal;

a pull-up driving unit, configured to an input node of the pull-up unit, the pull-up driving unit being configured to turn on the pull-up unit by means of charging a capacitor in response to a rising edge of an input signal inputted from the input terminal, turn off the input unit by means of discharging the capacitor in response to a rising edge of a driving signal, which is inputted from the control terminal, and drive the gate line connected to the next stage; and a pull-down driving unit, connected to an input node of the pull-down unit and connected to the input node of the pull-up unit, the pull-down driving unit being configured to turn off the pull-down unit, and turn on the pull-down unit in response to the rising edge of the driving signal for driving the gate line connected to the next stage.

35. The liquid crystal display apparatus of claim 34, wherein a number of the data lines is smaller than a number of the gate lines.

36. The liquid crystal display apparatus of claim 34, wherein a number of the data lines is greater than a number of channel terminals of the integrated driving chip.

37. The liquid crystal display apparatus of claim 34, wherein the integrated driving chip is further directly attached to the line block selecting circuit of the first substrate.

38. The liquid crystal display apparatus of claim 37, wherein the line block selecting circuit is directly attached to the first ends of the plurality of data lines of the first substrate.

39. The liquid crystal display apparatus of claim 34, wherein the pull-up unit comprises one transistor.

40. The liquid crystal display apparatus of claim 34, wherein the pull-down unit comprises one transistor.

41. A liquid crystal display apparatus comprising:

a first substrate having a display region and a peripheral region adjacent to the display region;

a second substrate facing the first substrate; and a liquid crystal interposed between the first and second substrates, wherein the first substrate further comprises:

a plurality of switching devices formed in the display region in a matrix;

a plurality of pixel electrodes formed in the display region in the matrix, each of the plurality of pixel electrodes being connected to a first current electrode of each switching device of the plurality of switching devices;

a plurality of gate lines arranged in a row, each of the plurality of gate lines being commonly connected to control electrodes of switching devices arranged in the row among the plurality of switching devices;

a plurality of data lines arranged in a column, each of the plurality of data lines being commonly connected to second current electrodes of switching devices arranged in the column among the plurality of switching devices; and an integrated driving chip, directly attached to a peripheral region to which first ends of the plurality of data lines are extended, for receiving external image data and external control signals, providing first gate driving signals to odd numbered gate lines of the plurality of gate lines, providing second gate driving signals to even numbered gate lines thereof, and providing analog driving signals to the plurality of data lines, each analog signal provided to the plurality of data lines from the integrated driving chip is commonly connected to at least two adjacent data lines of the plurality of data lines, wherein a portion of the peripheral region in which the integrated driving chip are formed does not correspond to the second substrate, the integrated driving chip comprises a first gate driving circuit and a second gate driving circuit, each of the first and second gate driving circuits comprises a shift register including cascade-connected plural stages, the plural stages having a first stage in which a start signal is applied to an input terminal of the first stage, and wherein the shift register sequentially selects the plural gate lines using an output signal outputted from an output terminal of each stage, each stage further comprises:

an input terminal connected to a gate line connected to the output terminal of a previous stage;

the output terminal connected to a corresponding gate line;

a control terminal connected to a gate line connected to the output terminal of a next stage;

a clock terminal into which a corresponding clock signal is inputted;

a pull-up unit configured to provide a corresponding clock signal of the first and second clock signals to the output terminal;

a pull-down unit configured to provide a first power voltage to the output terminal;

a pull-up driving unit, connected to an input node of the pull-up unit, the pull-up driving unit being configured to turn on the pull-up unit by means of charging a capacitor in response to a rising edge of an input signal inputted from the input terminal, turn off the pull-up unit by means of discharging the capacitor in response to a rising edge of a driving signal, which is inputted from the control terminal, and drive the gate line connected to the next stage; and a pull-down driving unit, connected to an input node of the pull-down unit and connected to the input node of the pull-up unit, the pull-down driving unit being configured to turn off the pull-down unit, and turn on the pull-down unit in response to the rising edge of the driving signal for driving the gate line connected to the next stage.

42. The liquid crystal display apparatus of claim 41, further comprising a line block selecting circuit, formed in a peripheral region to which first ends of the plurality of data lines are extended, for receiving analog driving signals of block-units, selecting one of line blocks of the plurality of data lines, and switching the analog driving signals of a block-unit to the data lines of the selected line block, and wherein the integrated driving chip further provides a line block selecting signals to the block-units of the line block selecting circuit.

43. The apparatus of claim 42, wherein the integrated driving chip comprises:

an interfacing part for interfacing the external image data and the external control signals;

a memory for storing the external image data;

a source driver for outputting the analog driving signals of block-units in response to image data of block-unit read out from the memory block by block;

a level shifter for shifting a level of a first driving control signal, a second driving control signal and the line block selecting signals; and the first gate driver for providing the first gate driving signal to the odd numbered gate lines of the plurality of gate lines in response to the first driving control signal;

the second gate driver for providing the second gate driving signal to the even numbered gate lines of the plurality of gate lines in response to the second driving control signal; and a controller for storing the external image data into the memory in response to the external control signals inputted from the interfacing part, generating the first and second driving control signals and the line block selecting signals, providing the first and second driving control signals and the line block selecting signals to the level shifter, reading out image data block by block from the memory, and providing the image data read out block by block to the source driver.

44. The apparatus of claim 43, wherein an output terminal for the first gate driving signal of the integrated driving chip is connected to the odd numbered gate lines of the plurality of gate lines at the peripheral region to which first ends of the plurality of gate lines are extended.

45. The apparatus of claim 43, wherein an output terminal for the second gate driving signal of the integrated driving chip is connected to the even numbered gate lines of the plurality of gate lines at the peripheral region to which second ends of the plurality of gate lines are extended.

46. The apparatus of claim 43, wherein the integrated driving chip further comprises:
a common voltage generator for generating a common voltage, and providing the common voltage to common electrode lines formed on a liquid crystal panel; and
a DC/DC converter for receiving an external power voltage, converting the external power voltage, and providing the converted power voltage to the controller, level shifter, source driver and common voltage generator.

47. The liquid crystal display apparatus of claim 42, wherein the integrated driving chip is further directly attached to the line block selecting circuit of the first substrate.

48. The liquid crystal display apparatus of claim 47, wherein the line block selecting circuit is further directly attached to the first ends of the plurality of data lines of the first substrate.

49. The liquid crystal display apparatus of claim 41, wherein a number of the data lines is smaller than a number of the gate lines.

50. The liquid crystal display apparatus of claim 41, wherein a number of the data lines is greater than a number of channel terminals of the integrated driving chip.

51. The liquid crystal display apparatus of claim 41, wherein the pull-up unit comprises one transistor.

52. The liquid crystal display apparatus of claim 41, wherein the pull-down unit comprises one transistor.

53. A liquid crystal display apparatus comprising:
a first substrate having a display region and a peripheral region adjacent to the display region;
a second substrate facing the first substrate; and
a liquid crystal interposed between the first and second substrates,
wherein the first substrate further comprises:
a plurality of switching devices formed in the display region in a matrix;
a plurality of pixel electrodes formed in the display region in the matrix, each of the plurality of pixel electrodes being connected to a first current electrode of each switching device of the plurality of switching devices;
a plurality of gate lines arranged in a row, each of the plurality of gate lines being commonly connected to control electrodes of switching devices arranged in the row among the plurality of switching devices;
a plurality of data lines arranged in a column, each of the plurality of data lines being commonly connected to second current electrodes of switching devices arranged in the column among the plurality of switching devices, a number of the data lines being different from a number of the gate lines;
a gate driving circuit, formed in a first region of the peripheral region to which first ends of the plurality of gate lines are extended, for sequentially scanning the plurality of gate lines; and
an integrated driving chip, directly attached to a second region of the peripheral region to which first ends of the plurality of data lines are extended, for providing a driving control signal to the gate driving circuit in response to an external image data and an external control signal, and providing an analog signal to the plurality of data lines, respectively, each analog signal provided to the plurality of data lines from the integrated driving chip is commonly connected to at least two data lines of the plurality of data lines,
wherein the first region of the peripheral region corresponds to the second substrate, and the second region of the peripheral region does not correspond to the second substrate,
the driving control signal comprises a start signal a first clock signal and a second clock signal,
the gate driving circuit comprises a shift register including cascade-connected plural stages, the plural stages having a first stage in which the start signal is applied to an input terminal of the first stage, and wherein the shift register sequentially selects the plural gate lines using an output signal outputted from an output terminal of each stage,
each stage further comprises:
an input terminal connected to a gate line connected to the output terminal of a previous stage;
the output terminal connected to a corresponding gate line;
a control terminal connected to a gate line connected to the output terminal of a next stage;
a clock terminal into which a corresponding clock signal is inputted;
a pull-up unit configured to provide a corresponding clock signal of the first and second clock signals to the output terminal;
a pull-down unit configured to provide a first power voltage to the output terminal;
a pull-up driving unit, connected to an input node of the pull-up unit, the pull-up driving unit being configured to turn on the pull-up unit by means of charging a capacitor in response to a rising edge of an input signal in inputted from the input terminal, turn off the pull-up unit by means of discharging the capacitor in response to a rising edge of a driving signal, which is inputted from the control terminal, and drive the gate line connected to the next stage; and
a pull-down driving unit, connected to an input node of the pull-down unit and connected to the input node of the pull-up unit, the pull-down driving unit being configured to turn off the pull-down unit, and turn on the pull-down unit in response to the rising edge of the driving signal for driving the gate line connected to the next stage.

54. The liquid crystal display apparatus of claim 53, wherein a number of the data lines is smaller than a number of the gate lines.

55. The liquid crystal display apparatus of claim 53, wherein the pull-up unit comprises one transistor.

56. The liquid crystal display apparatus of claim 53, wherein the pull-down unit comprises one transistor.

57. A liquid crystal display apparatus comprising:
- a first substrate having a display region and a peripheral region adjacent to the display region;
- a second substrate facing the first substrate; and
- a liquid crystal interposed between the first and second substrates,
- wherein the first substrate further comprises:
- a plurality of switching devices formed in the display region in a matrix;
- a plurality of pixel electrodes formed in the display region in the matrix, each of the plurality of pixel electrodes being connected to a first current electrode of each switching device of the plurality of switching devices;
- a plurality of gate lines arranged in a row, each of the plurality of gate lines being commonly connected to control electrodes of switching devices arranged in the row among the plurality of switching devices;
- a plurality of data lines arranged in a column, each of the plurality of data lines being commonly connected to second current electrodes of switching devices arranged in the column among the plurality of switching devices;
- a gate driving circuit, formed in a first region of the peripheral region to which first ends of the plurality of gate lines are extended, for sequentially scanning the plurality of gate lines;
- an integrated driving chip, directly attached to a second region of the peripheral region to which first ends of the plurality of data lines are extended, for providing a driving control signal to the gate driving circuit in response to an external image data and an external control signal, and providing an analog signal to the plurality of data lines, respectively; and
- a plurality of driving control signal wirings for providing the driving control signal to the gate driving circuit extended from the integrated driving chip to the gate driving circuit;
- wherein the first region of the peripheral region corresponds to the second substrate, and the second region of the peripheral region does not correspond to the second substrate,
- the driving control signal comprises a start signal, a first clock signal and a second clock signal,
- the gate driving circuit comprises a shift register including cascade-connected plural stages, the plural stages having a first stage in which the start signal is applied to an input terminal of the first stage, and wherein the shift register sequentially selects the plural gate lines using an output signal outputted from an output terminal of each stage,
- each stage further comprises:
- an input terminal connected to a gate line connected to the output terminal of a previous stage;
- the output terminal connected to a corresponding gate line;
- a control terminal connected to a gate line connected to the output terminal of a next stage;
- a clock terminal into which a corresponding clock signal is inputted: a pull-up unit configured to provide a corresponding clock signal of the first and second clock signals to the output terminal;
- a pull-down unit configured to provide a first power voltage to the output terminal;
- a pull-up unit, connected to an input node of the pull-up unit, the pull-up driving unit being configured to turn on the pull-up unit by means of charging a capacitor in response to a rising edge of an input signal inputted from the input terminal, turn off the pull-up unit by means of discharging the capacitor in response to a rising edge of a driving signal, which is inputted from the control terminal, and drive the gate line connected to the next stage; and
- a pull-down driving unit, connected to an input node of the pull-down unit and connected to the input node of the pull-up unit, the pull-down driving unit being configured to turn off the pull-down unit, and turn on the pull-down unit in response to the rising edge of the driving signal for driving the gate line connected to the next stage.

58. The apparatus of claim 57, wherein the integrated driving chip further comprises a first group of output terminals for outputting the driving control signal and a second group of channel terminals which is connected to the plurality of data lines.

59. The apparatus of claim 58, wherein the first group of output terminals comprises a start signal output terminal, a first clock output terminal and a second clock output terminal.

60. The apparatus of claim 57, wherein the plurality of driving control signal wirings connected the first group of output terminals.

61. The liquid crystal display apparatus of claim 57, wherein the pull-up unit comprises one transistor.

62. The liquid crystal display apparatus of claim 57, wherein the pull-down unit comprises one transistor.

* * * * *